(12) United States Patent
Xue et al.

(10) Patent No.: US 9,673,837 B2
(45) Date of Patent: Jun. 6, 2017

(54) INCREASING CAPACITY IN WIRELESS COMMUNICATIONS

(75) Inventors: Yisheng Xue, Beijing (CN); Mingxi Fan, San Diego, CA (US); Jiye Liang, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 449 days.

(21) Appl. No.: 13/504,699

(22) PCT Filed: Nov. 27, 2009

(86) PCT No.: PCT/CN2009/075179
§ 371 (c)(1),
(2), (4) Date: Jun. 7, 2012

(87) PCT Pub. No.: WO2011/063569
PCT Pub. Date: Jun. 3, 2011

(65) Prior Publication Data
US 2012/0243515 A1    Sep. 27, 2012

(51) Int. Cl.
*H04W 72/04* (2009.01)
*H03M 13/23* (2006.01)
(Continued)

(52) U.S. Cl.
CPC ....... *H03M 13/23* (2013.01); *H03M 13/3938* (2013.01); *H03M 13/41* (2013.01);
(Continued)

(58) Field of Classification Search
CPC . H04W 72/0446; H04W 84/12; H04W 84/18; H04W 88/08; H04W 74/04;
(Continued)

(56) References Cited

U.S. PATENT DOCUMENTS 4,718,066 A    1/1988  Rogard
4,885,744 A    12/1989 Lespagnol et al.
(Continued)

FOREIGN PATENT DOCUMENTS

CN    1207835 A    2/1999
CN    1250269 A    4/2000
(Continued)

OTHER PUBLICATIONS

3rd Generation Partnership, Project 2 "3GPP2" Physical Layer Standard for cdma2000,Spread Spectrum Systems. Revision D, 3GPP2 C.S0002-D, Version 2.0, Sep. 30, 2005 (538 pages).
(Continued)

*Primary Examiner* — Mang Yeung
*Assistant Examiner* — Natali N Pascual Peguero
(74) *Attorney, Agent, or Firm* — Darren Simon; Guy Perry

(57) ABSTRACT

Techniques to increase the capacity of a W-CDMA wireless communications system. In an exemplary embodiment, early termination (400) of one or more transport channels on a W-CDMA wireless communications link is provided. In particular, early decoding (421, 423) is performed on slots as they are received over the air, and techniques are described for signaling (431, 432) acknowledgment messages (ACK's) for one or more transport channels correctly decoded to terminate the transmission of those transport channels. The techniques may be applied to the transmission of voice signals using the adaptive multi-rate (AMR) codec. Further exemplary embodiments describe aspects to reduce the transmission power and rate of power control commands sent over the air, as well as aspects for applying tail-biting convolutional codes (1015) in the system.

36 Claims, 20 Drawing Sheets

(51) Int. Cl.
  *H03M 13/39* (2006.01)
  *H03M 13/41* (2006.01)
  *H03M 13/00* (2006.01)
  *H04L 1/18* (2006.01)
  *H03M 13/09* (2006.01)

(52) U.S. Cl.
  CPC ..... *H03M 13/6306* (2013.01); *H03M 13/653* (2013.01); *H03M 13/6525* (2013.01); *H03M 13/6558* (2013.01); *H04L 1/1887* (2013.01); *H03M 13/09* (2013.01); *Y02B 60/50* (2013.01)

(58) Field of Classification Search
  CPC ... H04B 7/2643; H04B 7/2656; H04L 65/102; H04L 1/1887; H04Q 11/08; H04Q 2213/13393; H03M 13/23; H03M 13/3938; H03M 13/41; H03M 13/6306; H03M 13/6525; H03M 13/653; H03M 13/6558; H03M 13/09; Y02B 60/50
  USPC .......................... 370/336, 337, 347, 355, 376
  See application file for complete search history.

(56) References Cited

U.S. PATENT DOCUMENTS

| | | |
|---|---|---|
| 5,172,118 A | 12/1992 | Peregrim et al. |
| 5,173,702 A | 12/1992 | Young et al. |
| 5,173,703 A | 12/1992 | Mangiapane et al. |
| 5,185,608 A | 2/1993 | Pozgay |
| 5,267,249 A | 11/1993 | Dong |
| 5,710,784 A | 1/1998 | Kindred et al. |
| 5,721,745 A | 2/1998 | Hladik et al. |
| 5,751,725 A | 5/1998 | Chen |
| 5,774,450 A | 6/1998 | Harada et al. |
| 5,774,496 A | 6/1998 | Butler et al. |
| 5,887,035 A | 3/1999 | Molnar |
| 5,960,361 A | 9/1999 | Chen |
| 5,983,383 A | 11/1999 | Wolf |
| 6,108,373 A | 8/2000 | Fargues et al. |
| 6,169,759 B1 | 1/2001 | Kanterakis et al. |
| 6,208,699 B1 | 3/2001 | Chen et al. |
| 6,259,730 B1 | 7/2001 | Solondz |
| 6,282,233 B1 | 8/2001 | Yoshida |
| 6,285,682 B1 | 9/2001 | Proctor et al. |
| 6,396,867 B1 | 5/2002 | Tiedemann, Jr. et al. |
| 6,480,558 B1 | 11/2002 | Ottosson et al. |
| 6,496,706 B1 | 12/2002 | Jou et al. |
| 6,532,254 B1 | 3/2003 | Jokinen |
| 6,545,989 B1 | 4/2003 | Butler |
| 6,553,224 B1 | 4/2003 | Kim |
| 6,587,522 B1 | 7/2003 | Wheeler et al. |
| 6,590,881 B1 | 7/2003 | Wallace et al. |
| 6,615,030 B1 | 9/2003 | Saito et al. |
| 6,628,707 B2 | 9/2003 | Rafie et al. |
| 6,633,601 B1 | 10/2003 | Yang |
| 6,741,661 B2 | 5/2004 | Wheatley, III |
| 6,744,814 B1 | 6/2004 | Blanksby et al. |
| 6,747,963 B1 | 6/2004 | Park et al. |
| 6,765,531 B2 | 7/2004 | Anderson |
| 6,765,894 B1 | 7/2004 | Hayashi |
| 6,771,689 B2 | 8/2004 | Solondz |
| 6,771,934 B2 | 8/2004 | Demers et al. |
| 6,834,197 B2 | 12/2004 | Nakahara et al. |
| 6,907,092 B1 | 6/2005 | Yakhnich et al. |
| 6,917,607 B1 | 7/2005 | Yeom et al. |
| 6,931,030 B1 | 8/2005 | Dogan |
| 6,934,264 B2 | 8/2005 | Jou |
| 6,956,893 B2 | 10/2005 | Frank et al. |
| 6,959,010 B1 | 10/2005 | Bahrenburg et al. |
| 6,975,604 B1 | 12/2005 | Ishida et al. |
| 6,977,888 B1 | 12/2005 | Frenger et al. |
| 6,983,166 B2 | 1/2006 | Shiu et al. |
| 6,985,516 B1 | 1/2006 | Easton et al. |
| 7,006,439 B2 | 2/2006 | Thron et al. |
| 7,006,795 B2 | 2/2006 | Foschini et al. |
| 7,013,147 B1 | 3/2006 | Kuwahara et al. |
| 7,031,742 B2 | 4/2006 | Chen et al. |
| 7,042,869 B1 | 5/2006 | Bender |
| 7,051,268 B1 | 5/2006 | Sindhushayana et al. |
| 7,107,031 B2 | 9/2006 | Kristensson et al. |
| 7,116,735 B2 | 10/2006 | Yamada et al. |
| 7,123,590 B2 | 10/2006 | Mir et al. |
| 7,130,365 B2 | 10/2006 | Li |
| 7,167,502 B1 | 1/2007 | Tsaur |
| 7,187,736 B2 | 3/2007 | Buckley et al. |
| 7,200,172 B2 | 4/2007 | Pukkila et al. |
| 7,224,962 B1 | 5/2007 | Kite |
| 7,295,636 B2 | 11/2007 | Onggosanusi et al. |
| 7,298,806 B1 | 11/2007 | Varma et al. |
| 7,302,009 B2 | 11/2007 | Walton et al. |
| 7,308,056 B2 | 12/2007 | Pukkila et al. |
| 7,313,189 B2 | 12/2007 | Yoshida et al. |
| 7,315,527 B2 | 1/2008 | Wei et al. |
| 7,349,379 B2 | 3/2008 | Schmidl et al. |
| 7,406,065 B2 | 7/2008 | Willenegger et al. |
| 7,466,666 B2 | 12/2008 | Yoon et al. |
| 7,613,144 B2 | 11/2009 | Malladi et al. |
| 7,620,662 B2 | 11/2009 | Kassai et al. |
| 7,630,321 B2 | 12/2009 | Jain et al. |
| 7,649,839 B2 | 1/2010 | Dendy |
| 7,650,116 B2 | 1/2010 | Haartsen |
| 7,693,210 B2 | 4/2010 | Margetts et al. |
| 7,706,430 B2 | 4/2010 | Guo et al. |
| 7,724,701 B2 | 5/2010 | Lundby et al. |
| 7,764,726 B2 | 7/2010 | Simic et al. |
| 7,783,312 B2 | 8/2010 | Mudigonda et al. |
| 7,801,248 B2 | 9/2010 | Challa et al. |
| 7,881,711 B2 | 2/2011 | Lundby |
| 7,933,256 B2 | 4/2011 | Abrishamkar et al. |
| 8,077,637 B2 | 12/2011 | Fujimoto |
| 8,160,002 B2 | 4/2012 | Rajkotia et al. |
| 8,201,039 B2 | 6/2012 | Tiedemann, Jr. et al. |
| 8,259,848 B2 | 9/2012 | Malladi |
| 8,332,710 B2 | 12/2012 | Tsai et al. |
| 8,369,214 B2 | 2/2013 | Kim et al. |
| 8,396,440 B2 | 3/2013 | Canpolat et al. |
| 8,411,618 B2 | 4/2013 | Kim et al. |
| 8,428,109 B2 | 4/2013 | Yang et al. |
| 8,442,441 B2 | 5/2013 | Pfister et al. |
| 8,489,128 B2 | 7/2013 | Lundby |
| 8,503,591 B2 | 8/2013 | Sikri et al. |
| 8,509,293 B2 | 8/2013 | Sikri et al. |
| 8,588,119 B2 | 11/2013 | Panta et al. |
| 8,619,928 B2 | 12/2013 | Challa et al. |
| 8,660,145 B2 | 2/2014 | Carmon et al. |
| 8,675,796 B2 | 3/2014 | Sikri et al. |
| 2001/0018650 A1 | 8/2001 | DeJaco |
| 2001/0021229 A1* | 9/2001 | Belaiche .................. 375/295 |
| 2002/0006138 A1* | 1/2002 | Odenwalder ............ 370/468 |
| 2002/0037000 A1* | 3/2002 | Park .................. H04L 1/0009 370/349 |
| 2002/0046379 A1 | 4/2002 | Miki et al. |
| 2002/0071407 A1 | 6/2002 | Koo et al. |
| 2002/0093937 A1 | 7/2002 | Kim et al. |
| 2002/0131381 A1 | 9/2002 | Kim et al. |
| 2002/0131532 A1 | 9/2002 | Chi et al. |
| 2002/0132625 A1 | 9/2002 | Ogino et al. |
| 2002/0181557 A1 | 12/2002 | Fujii |
| 2003/0004784 A1 | 1/2003 | Li et al. |
| 2003/0041206 A1 | 2/2003 | Dickie |
| 2003/0063596 A1 | 4/2003 | Arslan et al. |
| 2003/0078067 A1 | 4/2003 | Kim et al. |
| 2003/0103470 A1 | 6/2003 | Yafuso |
| 2003/0112370 A1 | 6/2003 | Long et al. |
| 2003/0119451 A1 | 6/2003 | Jang et al. |
| 2003/0125037 A1 | 7/2003 | Bae et al. |
| 2003/0134656 A1 | 7/2003 | Chang et al. |
| 2003/0147476 A1 | 8/2003 | Ma et al. |
| 2003/0199290 A1 | 10/2003 | Viertola |
| 2003/0212816 A1 | 11/2003 | Bender et al. |
| 2003/0223396 A1 | 12/2003 | Tsai et al. |
| 2004/0001563 A1 | 1/2004 | Scarpa |
| 2004/0005897 A1 | 1/2004 | Tomoe et al. |

(56) References Cited

U.S. PATENT DOCUMENTS

| | | |
|---|---|---|
| 2004/0017311 A1 | 1/2004 | Thomas et al. |
| 2004/0043746 A1 | 3/2004 | Hiramatsu |
| 2004/0062302 A1 | 4/2004 | Fujii et al. |
| 2004/0081124 A1 | 4/2004 | Black et al. |
| 2004/0081195 A1 | 4/2004 | El-Maleh et al. |
| 2004/0081248 A1 | 4/2004 | Parolari |
| 2004/0082356 A1* | 4/2004 | Walton et al. ............... 455/522 |
| 2004/0085917 A1 | 5/2004 | Fitton et al. |
| 2004/0085936 A1 | 5/2004 | Gopalakrishnan et al. |
| 2004/0116122 A1 | 6/2004 | Zeira et al. |
| 2004/0131007 A1 | 7/2004 | Smee et al. |
| 2004/0141525 A1 | 7/2004 | Bhushan et al. |
| 2004/0157614 A1 | 8/2004 | Fujita et al. |
| 2004/0160933 A1 | 8/2004 | Odenwalder et al. |
| 2004/0168113 A1 | 8/2004 | Murata et al. |
| 2004/0185868 A1 | 9/2004 | Jain et al. |
| 2004/0198404 A1 | 10/2004 | Attar et al. |
| 2004/0203913 A1 | 10/2004 | Ogino et al. |
| 2004/0223507 A1 | 11/2004 | Kuchibhotla et al. |
| 2004/0223538 A1 | 11/2004 | Zeira |
| 2004/0229615 A1 | 11/2004 | Agrawal |
| 2004/0240400 A1 | 12/2004 | Khan |
| 2004/0240416 A1 | 12/2004 | Derryberry et al. |
| 2005/0013263 A1* | 1/2005 | Kim et al. .................... 370/320 |
| 2005/0018614 A1 | 1/2005 | Kiran |
| 2005/0037718 A1 | 2/2005 | Kim et al. |
| 2005/0037775 A1 | 2/2005 | Moeglein et al. |
| 2005/0053088 A1* | 3/2005 | Cheng et al. ................. 370/464 |
| 2005/0058154 A1 | 3/2005 | Lee et al. |
| 2005/0084045 A1 | 4/2005 | Stewart et al. |
| 2005/0111408 A1 | 5/2005 | Skillermark et al. |
| 2005/0147024 A1 | 7/2005 | Jung et al. |
| 2005/0153695 A1 | 7/2005 | Cho |
| 2005/0185364 A1 | 8/2005 | Bell et al. |
| 2005/0195889 A1 | 9/2005 | Grant et al. |
| 2005/0213505 A1 | 9/2005 | Iochi et al. |
| 2005/0220042 A1 | 10/2005 | Chang et al. |
| 2005/0232174 A1 | 10/2005 | Onggosanusi et al. |
| 2005/0249163 A1* | 11/2005 | Kim et al. .................... 370/335 |
| 2005/0265399 A1 | 12/2005 | El-Maleh et al. |
| 2005/0265465 A1 | 12/2005 | Hosur et al. |
| 2005/0277429 A1 | 12/2005 | Laroia et al. |
| 2006/0003792 A1 | 1/2006 | Gholmieh et al. |
| 2006/0050666 A1 | 3/2006 | Odenwalder |
| 2006/0126491 A1 | 6/2006 | Ro et al. |
| 2006/0126765 A1 | 6/2006 | Shin et al. |
| 2006/0126844 A1 | 6/2006 | Mauro |
| 2006/0141933 A1 | 6/2006 | Smee et al. |
| 2006/0141935 A1 | 6/2006 | Hou et al. |
| 2006/0142038 A1 | 6/2006 | Ozarow et al. |
| 2006/0146953 A1 | 7/2006 | Raghothaman et al. |
| 2006/0146969 A1 | 7/2006 | Zhang et al. |
| 2006/0203943 A1 | 9/2006 | Scheim et al. |
| 2006/0209783 A1 | 9/2006 | Jain et al. |
| 2006/0209902 A1 | 9/2006 | Grilli et al. |
| 2006/0209982 A1 | 9/2006 | De et al. |
| 2006/0227853 A1 | 10/2006 | Liang et al. |
| 2006/0234715 A1 | 10/2006 | Cho et al. |
| 2007/0021148 A1 | 1/2007 | Mahini |
| 2007/0040704 A1 | 2/2007 | Smee et al. |
| 2007/0050189 A1 | 3/2007 | Cruz-Zeno et al. |
| 2007/0058709 A1 | 3/2007 | Chen et al. |
| 2007/0058746 A1 | 3/2007 | Gueguen |
| 2007/0063897 A1 | 3/2007 | Matsuda |
| 2007/0071145 A1 | 3/2007 | Perets |
| 2007/0076707 A1 | 4/2007 | Link et al. |
| 2007/0086513 A1 | 4/2007 | Fernandez-Corbaton et al. |
| 2007/0110095 A1 | 5/2007 | Attar et al. |
| 2007/0112564 A1 | 5/2007 | Jelinek |
| 2007/0121554 A1 | 5/2007 | Luo et al. |
| 2007/0121764 A1 | 5/2007 | Chen et al. |
| 2007/0127608 A1 | 6/2007 | Scheim et al. |
| 2007/0133423 A1 | 6/2007 | Okumura |
| 2007/0133475 A1* | 6/2007 | Peisa et al. .................. 370/335 |
| 2007/0150787 A1 | 6/2007 | Kim et al. |
| 2007/0150788 A1* | 6/2007 | Zhuyan ........................ 714/749 |
| 2007/0183483 A1 | 8/2007 | Narayan et al. |
| 2007/0201548 A1 | 8/2007 | Badri-Hoeher et al. |
| 2007/0273698 A1 | 11/2007 | Du et al. |
| 2008/0019308 A1 | 1/2008 | Chuan-Lin et al. |
| 2008/0019467 A1 | 1/2008 | He |
| 2008/0031368 A1 | 2/2008 | Lindoff et al. |
| 2008/0057963 A1 | 3/2008 | Kayama et al. |
| 2008/0076432 A1 | 3/2008 | Senarath et al. |
| 2008/0080363 A1 | 4/2008 | Black et al. |
| 2008/0080406 A1 | 4/2008 | Peplinski et al. |
| 2008/0101440 A1 | 5/2008 | Lee |
| 2008/0125070 A1 | 5/2008 | Grieco et al. |
| 2008/0212462 A1 | 9/2008 | Ahn et al. |
| 2008/0227456 A1 | 9/2008 | Huang et al. |
| 2008/0232439 A1 | 9/2008 | Chen |
| 2008/0298497 A1* | 12/2008 | Cho ........................ H04L 1/1607 |
| | | 375/295 |
| 2008/0298521 A1 | 12/2008 | Wu |
| 2008/0298524 A1 | 12/2008 | Koorapaty et al. |
| 2008/0305790 A1 | 12/2008 | Wakabayashi |
| 2009/0022098 A1 | 1/2009 | Novak et al. |
| 2009/0052591 A1 | 2/2009 | Chen |
| 2009/0058728 A1 | 3/2009 | Mostafa et al. |
| 2009/0092178 A1 | 4/2009 | Sayana et al. |
| 2009/0109907 A1 | 4/2009 | Tsai et al. |
| 2009/0207944 A1 | 8/2009 | Furman et al. |
| 2009/0232052 A1 | 9/2009 | Black et al. |
| 2009/0252201 A1 | 10/2009 | Smee et al. |
| 2009/0303968 A1 | 12/2009 | Jou et al. |
| 2009/0303976 A1 | 12/2009 | Jou et al. |
| 2009/0304024 A1 | 12/2009 | Jou et al. |
| 2010/0027702 A1 | 2/2010 | Vijayan et al. |
| 2010/0029213 A1 | 2/2010 | Wang |
| 2010/0029262 A1 | 2/2010 | Wang et al. |
| 2010/0040005 A1* | 2/2010 | Kim et al. .................... 370/329 |
| 2010/0040035 A1 | 2/2010 | Shapiro et al. |
| 2010/0046660 A1 | 2/2010 | Sikri et al. |
| 2010/0054212 A1 | 3/2010 | Tang |
| 2010/0061496 A1 | 3/2010 | Black et al. |
| 2010/0097955 A1 | 4/2010 | Jou |
| 2010/0142479 A1 | 6/2010 | Black et al. |
| 2010/0172383 A1 | 7/2010 | Montalvo et al. |
| 2010/0202544 A1 | 8/2010 | Osseirar et al. |
| 2010/0248666 A1 | 9/2010 | Hui et al. |
| 2010/0278227 A1 | 11/2010 | Sikri et al. |
| 2010/0296556 A1 | 11/2010 | Rave et al. |
| 2010/0310026 A1 | 12/2010 | Sikri et al. |
| 2011/0051859 A1 | 3/2011 | Canpolat et al. |
| 2011/0264976 A1 | 10/2011 | Yang et al. |
| 2012/0281675 A1 | 11/2012 | Liang et al. |
| 2014/0187248 A1 | 7/2014 | Black et al. |

FOREIGN PATENT DOCUMENTS

| | | |
|---|---|---|
| CN | 1278382 A | 12/2000 |
| CN | 1304589 A | 7/2001 |
| CN | 1311612 A | 9/2001 |
| CN | 1315095 A | 9/2001 |
| CN | 1347604 A | 5/2002 |
| CN | 1394407 A | 1/2003 |
| CN | 1447549 A | 10/2003 |
| CN | 1497857 A | 5/2004 |
| CN | 1552133 A | 12/2004 |
| CN | 1726657 A | 1/2006 |
| CN | 1736101 A | 2/2006 |
| CN | 1742457 A | 3/2006 |
| CN | 1758563 A | 4/2006 |
| CN | 1893406 A | 1/2007 |
| CN | 1906862 A | 1/2007 |
| CN | 1983913 A | 6/2007 |
| CN | 101189901 A | 5/2008 |
| CN | 101366305 A | 2/2009 |
| CN | 101465689 A | 6/2009 |
| CN | 101483499 A | 7/2009 |
| CN | 1891002 A | 10/2010 |
| EP | 0396403 A1 | 11/1990 |
| EP | 0949766 A2 | 10/1999 |
| EP | 0969608 A2 | 1/2000 |

(56) References Cited

FOREIGN PATENT DOCUMENTS

| | | |
|---|---|---|
| EP | 1168703 A2 | 1/2002 |
| EP | 1199833 A2 | 4/2002 |
| EP | 1347611 A1 | 9/2003 |
| EP | 1398984 A1 | 3/2004 |
| EP | 1404047 A2 | 3/2004 |
| EP | 1411693 A2 | 4/2004 |
| EP | 1422900 A1 | 5/2004 |
| EP | 1478117 A2 | 11/2004 |
| EP | 1569399 A1 | 8/2005 |
| EP | 1643737 A1 | 4/2006 |
| EP | 1677433 A1 | 7/2006 |
| EP | 1681775 A2 | 7/2006 |
| EP | 1699194 A1 | 9/2006 |
| EP | 1699195 A1 | 9/2006 |
| EP | 1701565 A1 | 9/2006 |
| EP | 1703659 A2 | 9/2006 |
| EP | 1821497 A1 | 8/2007 |
| EP | 1928138 A2 | 6/2008 |
| GB | 2337417 | 11/1999 |
| JP | 62239735 A | 10/1987 |
| JP | 10500811 | 1/1998 |
| JP | H10327126 A | 12/1998 |
| JP | 2000059290 A | 2/2000 |
| JP | 2000261397 A | 9/2000 |
| JP | 2001036964 A | 2/2001 |
| JP | 2001078252 | 3/2001 |
| JP | 2001166026 A | 6/2001 |
| JP | 2001511963 A | 8/2001 |
| JP | 2001512916 A | 8/2001 |
| JP | 3210915 B2 | 9/2001 |
| JP | 2001257626 A | 9/2001 |
| JP | 2001267987 A | 9/2001 |
| JP | 2001519113 | 10/2001 |
| JP | 2002009741 A | 1/2002 |
| JP | 2002506583 | 2/2002 |
| JP | 2002507342 A | 3/2002 |
| JP | 2002508129 A | 3/2002 |
| JP | 2002532008 T | 9/2002 |
| JP | 2002539711 A | 11/2002 |
| JP | 2002353824 | 12/2002 |
| JP | 2003051762 A | 2/2003 |
| JP | 2003152603 A | 5/2003 |
| JP | 2003518344 | 6/2003 |
| JP | 2003194916 A | 7/2003 |
| JP | 2003244103 A | 8/2003 |
| JP | 2003338779 A | 11/2003 |
| JP | 2004502323 | 1/2004 |
| JP | 2004048307 A | 2/2004 |
| JP | 2004064691 A | 2/2004 |
| JP | 2004112094 A | 4/2004 |
| JP | 2004511189 A | 4/2004 |
| JP | 2004512733 A | 4/2004 |
| JP | 2004159277 A | 6/2004 |
| JP | 2004166218 A | 6/2004 |
| JP | 2004194288 A | 7/2004 |
| JP | 2004531975 | 10/2004 |
| JP | 2004343754 A | 12/2004 |
| JP | 2005065197 A | 3/2005 |
| JP | 2005510940 A | 4/2005 |
| JP | 2005517343 | 6/2005 |
| JP | 2006501707 | 1/2006 |
| JP | 2006502622 A | 1/2006 |
| JP | 2006503485 A | 1/2006 |
| JP | 2006180266 A | 7/2006 |
| JP | 2006191582 A | 7/2006 |
| JP | 2006191587 A | 7/2006 |
| JP | 2006314086 A | 11/2006 |
| JP | 2007503169 A | 2/2007 |
| JP | 2007195247 A | 8/2007 |
| JP | 2007524269 A | 8/2007 |
| JP | 2007525103 A | 8/2007 |
| JP | 2008053889 A | 3/2008 |
| JP | 2008526136 A | 7/2008 |
| JP | 2008199493 A | 8/2008 |
| JP | 2008278338 A | 11/2008 |
| JP | 2008539664 A | 11/2008 |
| JP | 2009504097 A | 1/2009 |
| JP | 2009515219 A | 4/2009 |
| JP | 2009545219 A | 12/2009 |
| JP | 4643656 | 12/2010 |
| JP | 2005538650 | 12/2010 |
| JP | 2011521373 A | 7/2011 |
| KR | 20000052668 A | 8/2000 |
| KR | 20000071672 A | 11/2000 |
| KR | 20010031665 | 4/2001 |
| KR | 20010085143 A | 9/2001 |
| KR | 20020092136 | 12/2002 |
| KR | 20030059528 A | 7/2003 |
| KR | 20040097893 A | 11/2004 |
| KR | 20040108813 | 12/2004 |
| KR | 20050073113 A | 7/2005 |
| KR | 1020050097552 A | 10/2005 |
| KR | 20070091214 A | 9/2007 |
| KR | 20070104633 A | 10/2007 |
| KR | 20080031502 A | 4/2008 |
| KR | 20080039772 A | 5/2008 |
| RU | 2211531 C2 | 8/2003 |
| RU | 2233033 C2 | 7/2004 |
| RU | 2233045 C2 | 7/2004 |
| RU | 2252487 C2 | 5/2005 |
| RU | 2280329 C1 | 7/2006 |
| RU | 2319307 C2 | 3/2008 |
| RU | 2323529 C2 | 4/2008 |
| TW | 365717 | 8/1999 |
| TW | 200640202 | 11/2006 |
| TW | 200704232 | 1/2007 |
| TW | 201008148 A | 2/2010 |
| WO | 9526593 | 10/1995 |
| WO | 9832231 A1 | 7/1998 |
| WO | 9857452 A1 | 12/1998 |
| WO | 9857509 A2 | 12/1998 |
| WO | 9901950 A2 | 1/1999 |
| WO | 9912273 A1 | 3/1999 |
| WO | 9923844 | 5/1999 |
| WO | 9929048 | 6/1999 |
| WO | 0033528 A1 | 6/2000 |
| WO | 0035117 A2 | 6/2000 |
| WO | 0035126 | 6/2000 |
| WO | 0055992 A1 | 9/2000 |
| WO | 0062456 A1 | 10/2000 |
| WO | WO-0070786 A1 | 11/2000 |
| WO | 0108324 | 2/2001 |
| WO | 0117158 | 3/2001 |
| WO | 0223792 A1 | 3/2002 |
| WO | 0230004 | 4/2002 |
| WO | 0230004 A2 | 4/2002 |
| WO | 0232003 A1 | 4/2002 |
| WO | 0233877 A1 | 4/2002 |
| WO | 0245288 A2 | 6/2002 |
| WO | 02067444 A1 | 8/2002 |
| WO | 02103920 A2 | 12/2002 |
| WO | 03001834 A1 | 1/2003 |
| WO | WO-03017527 | 2/2003 |
| WO | WO-03021905 A1 | 3/2003 |
| WO | 03047124 A1 | 6/2003 |
| WO | 03067783 | 8/2003 |
| WO | WO-03079577 A2 | 9/2003 |
| WO | 03105370 A1 | 12/2003 |
| WO | 2004010573 A1 | 1/2004 |
| WO | WO 2004015909 A1 * | 2/2004 |
| WO | 2004025986 A2 | 3/2004 |
| WO | 2004032369 A2 | 4/2004 |
| WO | 2004066666 | 8/2004 |
| WO | WO-2004084480 A1 | 9/2004 |
| WO | 2004102864 A1 | 11/2004 |
| WO | 2004107768 A2 | 12/2004 |
| WO | 2004114582 A1 | 12/2004 |
| WO | 2005020464 A1 | 3/2005 |
| WO | 2005034383 A2 | 4/2005 |
| WO | 2005053177 A1 | 6/2005 |
| WO | 2006004948 | 1/2006 |
| WO | 2006060605 A2 | 6/2006 |
| WO | 2006071761 | 7/2006 |
| WO | 2006072088 A1 | 7/2006 |

(56) References Cited

FOREIGN PATENT DOCUMENTS

| WO | 2006115979 A1 | 11/2006 |
|---|---|---|
| WO | 2007000620 A1 | 1/2007 |
| WO | 2007016553 A1 | 2/2007 |
| WO | 2007029958 A1 | 3/2007 |
| WO | 2007060093 A1 | 5/2007 |
| WO | 2007060229 A1 | 5/2007 |
| WO | WO-2007053840 | 5/2007 |
| WO | 2007140338 | 12/2007 |
| WO | 2008005890 | 1/2008 |
| WO | 2008012265 A1 | 1/2008 |
| WO | 2008027192 A2 | 3/2008 |
| WO | 2008156061 A1 | 12/2008 |
| WO | 2009108586 A2 | 9/2009 |
| WO | 2009137464 A2 | 11/2009 |
| WO | 2009140338 A2 | 11/2009 |
| WO | 2009152138 A2 | 12/2009 |
| WO | 2010014968 A1 | 2/2010 |
| WO | 2011028978 | 3/2011 |

OTHER PUBLICATIONS

International Search Report and Written Opinion—PCT/CN2009/075179, International Search Authority—European Patent Office—Sep. 2, 2010.

Chen. B Y., et al., "Using H.264 Coded Block Patterns for Fast Inter-Mode Selection" Multimedia and Expo, 2008 IEEE International Conference on, IEEE, Piscataway, NJ, USA, Jun. 23, 2008 (Jun. 23, 2008), pp. 721-724, XP031312823 ISBN: 978-1-4244-2570-9.

JVT: "Draft ITU-T Recommendation and Final Draft International Standard of Joint Video Specification (ITU-T Rec. H .264 ISO/IEC 14496-10 AVC)", 7. JVT Meeting; 64. MPEG Meeting; Mar. 7, 2003-Mar. 14, 2003; Pattaya,TH; (Joint Video Team of ISO/IEC JTC1/SC29/WG11 and ITU-T 56.16 ), No. JVT-G050r1, Mar. 14, 2003 (Mar. 14, 2003) , XP030005712, ISSN: 0000-0427.

Taiwan Search Report—TW099105984—TIPO—Feb. 26, 2013.

Lakkavalli, S., et al., "Stretchable Architectures for Next Generation Cellular Networks", ISART'03, Mar. 4, 2003, 7 pages.

NTT DoCoMo: "Text proposals for detailed channel coding," 3GPP TSG-RAN WG1#7, R1-99b49, Aug. 1999, pp. 24.

"Soft Handoff and Power Control in IS-95 CDMA", CDMA95.10, Dec. 6, 1999, pp. 181-212.

Tseng, S-M., et al., Fuzzy adaptive parallel interference cancellation and vector channel prediction for CDMA in fading channels, Communications, 2002. ICC 2002. IEEE International Conference on, 2002, vol. 1, pp. 252-256.

3GPP Draft; 25.814-V1.5.0, 3rd Generation Partnership Project (3GPP), Mobile Competence Centre ; 650, Route Des Lucioles ; F-06921 Sophia-Antipolis Cedex ; France, vol. RAN WG1, No. Shanghai, China; May 26, 2006, May 26, 2006 (May 26, 2006), XP050102001 pp. 29-30 p. 76 pp. 89-90.

Chunguang, W., et al., "Enhanced OTDOA Technology in 3G Location Service", Shanghai Research Institute of China Telecom, Shanghai 200122, China, Aug. 31, 2005.

Divsalar, D., et al., "Improved parallel interference cancellation for CDMA", Communications, IEEE Transactions on, Feb. 1998, vol. 46, Issue: 2, pp. 258-268.

Huaiyu, D. et al., "Asymptotic spectral efficiency of multi cell MIMO systems with frequency-flat fading," IEEE Transactions on Signal Processing, IEEE Service Center, New York, NY, US, vol. 51, No. 11, Nov. 1, 2003, pp. 2976-2988, XP011102811.

Meyr, H. et al., "Chapter 5: Synthesis of Synchronization Algorithms" and "Chapter 8: Frequency Estimation," Jan. 1, 1998, Digital Communication Receivers:Synchronization,Channel Estimation, and Signal Processing; John Wiley and Sons, Inc.: New York, pp. 271-323,445, XP002547568.

Natali F.D., "AFC Tracking Algorithms" IEEE Transactions on Communications, IEEE Service Center, Piscataway, NJ, US, vol. COM-32, No. 8, Aug. 1, 1984 (Aug. 1, 1984), pp. 935-947, XP000758571 ISSN: 0090-6778 abstract p. 941, section C.

Olivier J.C., et al., "Single antenna interference cancellation for synchronised GSM networks using a widely linear receiver" (Feb. 1, 2007) pp. 131-136, XP006028092.

Pais, A.V., et al., "Indoor DS-CDMA system deployment and performance with successive interference cancellation," Electronics Letters: GB, vol. 40, No. 19, Sep. 16, 2004, pp. 1200-1201, XP006022654.

RITT: "Performance of IDMA-based inter-cell interference cancellation," 3GPP Draft TSG-RAN WG1 #44-bis Meeting, R1-060895, 3rd Generation Partnership Project (3GPP), Athens, Greece; Mar. 27, 2006, XP050101801, pp. 1-5.

Sawahashi M., et al., "Multipath Interference Canceller for Orthogonal Multiplexed Channel and its Performance in W-CDMA Forward Link," Technical Report of the Institute of Electronics, Information and Communication Engineers, Jan. 12, 2001, vol. 100, No. 558, pp. 27-33, RCS2000-195.

Xiaofa, L., "The study of Interference Cancellation based on Multi-User Detection", Chinese Scientific Papers Online, pp. 7, Mar. 27, 2008.

Philips, "Mapping of Transport Channels to Physical Channels [online]," 3GPP TSG-RAN WG2#51 R2-060424, , Feb. 2006.

Qualcomm Europe: "On E-DCH structure", 3GPP Draft, R1-040538, 3rd Generation Partnership Project (3GPP), Mobile Competence Centre, 650, Route Des Lucioles, F-06921 Sophia-Antipolis Cedex, France, vol. RAN WG1, No. Montreal, Canada, May 6, 2004, May 6, 2004 (May 6, 2004), XP050098746, [retrieved on May 6, 2004] * Section 3 *.

Qualcomm Incorporated: "Introducing Enhancements to CS voice over DCH," 3GPP Draft; R1-123809 (3GPP),Mobile Competence Centre ; 650, Route Des Lucioles ; F-06921 Sophia-Antipolis Cedex ; FR, vol. RAN WG1, No. Qingdao, China; Aug. 13, 2012-Aug. 17, 2012 Aug. 5, 2012 (Aug. 5, 2012). XP050661662.

Supplementary European Search Report—EP09851582—Search Authority—Munich—Jul. 31, 2014.

Wu Q ., et al., "The cdma2000 High Rate Packet Data System", Internet Citation, Mar. 26, 2002 (Mar. 26, 2002), XP002303829, Retrieved from the Internet: URL: http://www.qualcomm.com/technology/1xe v-do/publishedpapers/cdma2000 HighRatePacket.pdf [retrieved on Nov. 3, 2004] Sections 3.1.7 and 3.2.

\* cited by examiner

1200

| Early decoding attempt priority table | |
|---|---|
| UE Index | Allocation Indicator |
| #1 | 10 |
| #2 | 5 |
| #3 | 3 |
| #4 | 2 |

FIG 12

INCREASING CAPACITY IN WIRELESS COMMUNICATIONS

RELATED APPLICATIONS

This application is related to U.S. application Ser. No. 12/424,050, entitled "Increasing Capacity in Wireless Communications," filed Apr. 15, 2009, which claims priority to U.S. Provisional Application Ser. No. 61/060,119, entitled "Apparatus and Methods for Increasing Capacity in Wireless Communications," filed Jun. 9, 2008, and U.S. Provisional Application Ser. No. 61/060,408, entitled "Apparatus and Methods for Increasing Capacity in Wireless Communications," filed Jun. 10, 2008, and U.S. Provisional Application Ser. No. 61/061,546, entitled "Apparatus and Methods for Increasing Capacity in Wireless Communications," filed Jun. 13, 2008, the contents of which are hereby incorporated by reference in their entirety.

TECHNICAL FIELD

The present invention relates generally to digital communications, and more specifically, to techniques for reducing transmission power and improving the capacity of wireless digital communications systems.

BACKGROUND

Wireless communications systems are widely deployed to provide various types of communication such as voice, packet data, and so on. These systems may be based on code division multiple access (CDMA), time division multiple access (TDMA), frequency division multiple access (FDMA), or other multiple access techniques. For example, such systems can conform to standards such as Third-Generation Partnership Project 2 (3gpp2, or "cdma2000"), Third-Generation Partnership (3gpp, or "W-CDMA"), or Long Term Evolution ("LTE").

Transmissions from a transmitter to a receiver often employ a degree of redundancy to guard against errors in the received signals. For example, in a W-CDMA system, information bits corresponding to a transport channel may be processed using fractional-rate symbol encoding and symbol repetition (or puncturing). Such encoded symbols may be further multiplexed with encoded symbols from one or more other transport channels, grouped into sub-segments known as slots, and transmitted over the air. While symbol redundancy techniques may allow accurate recovery of the information bits in the presence of noise over the channel, such techniques also represent a premium in the overall system transmission power when signal reception conditions are good. Such a premium may undesirably reduce the system capacity, i.e., the number of users the system can reliably support at any given time.

It would be desirable to provide techniques to allow efficient transmission of data in a W-CDMA system to minimize transmission redundancy and increase capacity.

SUMMARY

An aspect of the present disclosure provides a method comprising: multiplexing at least two transport channels to generate a composite channel; transmitting symbols corresponding to the composite channel during a first allotted transmission time interval (TTI); receiving an acknowledgment message (ACK) for at least one of the transport channels during the transmitting the symbols; and puncturing the symbols corresponding to the at least one of the acknowledged transport channels for the remainder of the first TTI.

Another aspect of the present disclosure provides an apparatus comprising: a multiplexing module configured to multiplex at least two transport channels to generate a composite channel; a transmitter configured to transmit symbols corresponding to the composite channel during a first allotted transmission time interval (TTI); a receiver configured to receive an acknowledgment message (ACK) for at least one of the transport channels during the transmitting the symbols; and a puncturing module configured to puncture the symbols corresponding to the at least one of the acknowledged transport channels for the remainder of the first TTI.

Yet another aspect of the present disclosure provides an apparatus comprising: means for multiplexing at least two transport channels to generate a composite channel; means for transmitting symbols corresponding to the composite channel during a first allotted transmission time interval (TTI); means for receiving an acknowledgment message (ACK) for at least one of the transport channels during the transmitting the symbols; and means for puncturing the symbols corresponding to the at least one of the acknowledged transport channels for the remainder of the first TTI.

Yet another aspect of the present disclosure provides a computer-readable storage medium storing instructions for causing a computer to: multiplex at least two transport channels to generate a composite channel; transmit symbols corresponding to the composite channel during a first allotted transmission time interval (TTI); receive an acknowledgment message (ACK) for at least one of the transport channels during the transmitting the symbols; and puncture the symbols corresponding to the at least one of the acknowledged transport channels for the remainder of the first TTI.

BRIEF DESCRIPTION OF DRAWINGS

FIG. 12 illustrates an exemplary embodiment of a table that may be maintained at a Node B that prioritizes early decoding attempts for the UE's communicating with the Node B on the uplink.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
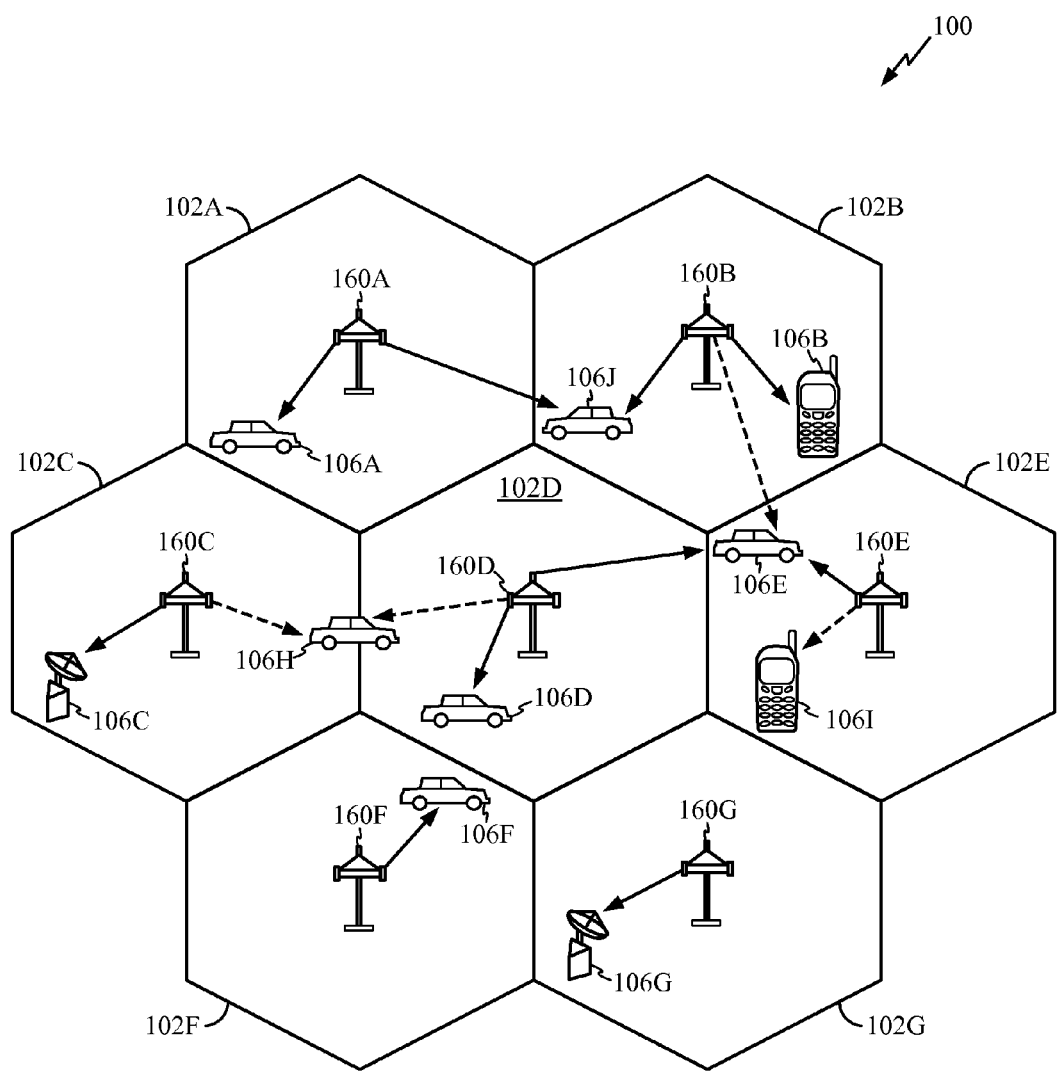
FIG. 1 illustrates a wireless cellular communications system in which the techniques of the present disclosure may be applied.

Communications systems may use a single carrier frequency or multiple carrier frequencies. Referring to FIG. 1, in a wireless cellular communications system 100, reference numerals 102A to 102G refer to cells, reference numerals 160A to 160G refer to Node B's, and reference numerals 106A to 106I refer to User Equipment (UE's). A communications channel includes a downlink (also known as a forward link) for transmissions from a Node B 160 to a UE 106 and an uplink (also known as a reverse link) for transmissions from a UE 106 to a Node B 160. A Node B is also referred to as a base transceiver system (BTS), an access point, or a base station. The UE 106 is also known as an access station, a remote station, a mobile station or a subscriber station. The UE 106 may be mobile or stationary. Furthermore, a UE 106 may be any data device that communicates through a wireless channel or through a wired channel, for example using fiber optic or coaxial cables. A UE 106 may further be any of a number of types of devices including but not limited to PC card, compact flash, external or internal modem, or wireless or wireline phone.

Modern communications systems are designed to allow multiple users to access a common communications medium. Numerous multiple-access techniques are known in the art, such as time division multiple-access (TDMA), frequency division multiple-access (FDMA), space division multiple-access, polarization division multiple-access, code division multiple-access (CDMA), and other similar multiple-access techniques. The multiple-access concept is a channel allocation methodology which allows multiple users access to a common communications link. The channel allocations can take on various forms depending on the specific multi-access technique. By way of example, in FDMA systems, the total frequency spectrum is divided into a number of smaller sub-bands and each user is given its own sub-band to access the communications link. Alternatively, in CDMA systems, each user is given the entire frequency spectrum for all of the time but distinguishes its transmission through the use of a code.

While certain exemplary embodiments of the present disclosure may be described hereinbelow for operation according to the W-CDMA standard, one of ordinary skill in the art will appreciate that the techniques may readily be applied to other digital communications systems. For example, the techniques of the present disclosure may also be applied to systems based on the cdma2000 wireless communications standard, and/or any other communications standards. Such alternative exemplary embodiments are contemplated to be within the scope of the present disclosure.

Figure 2A:
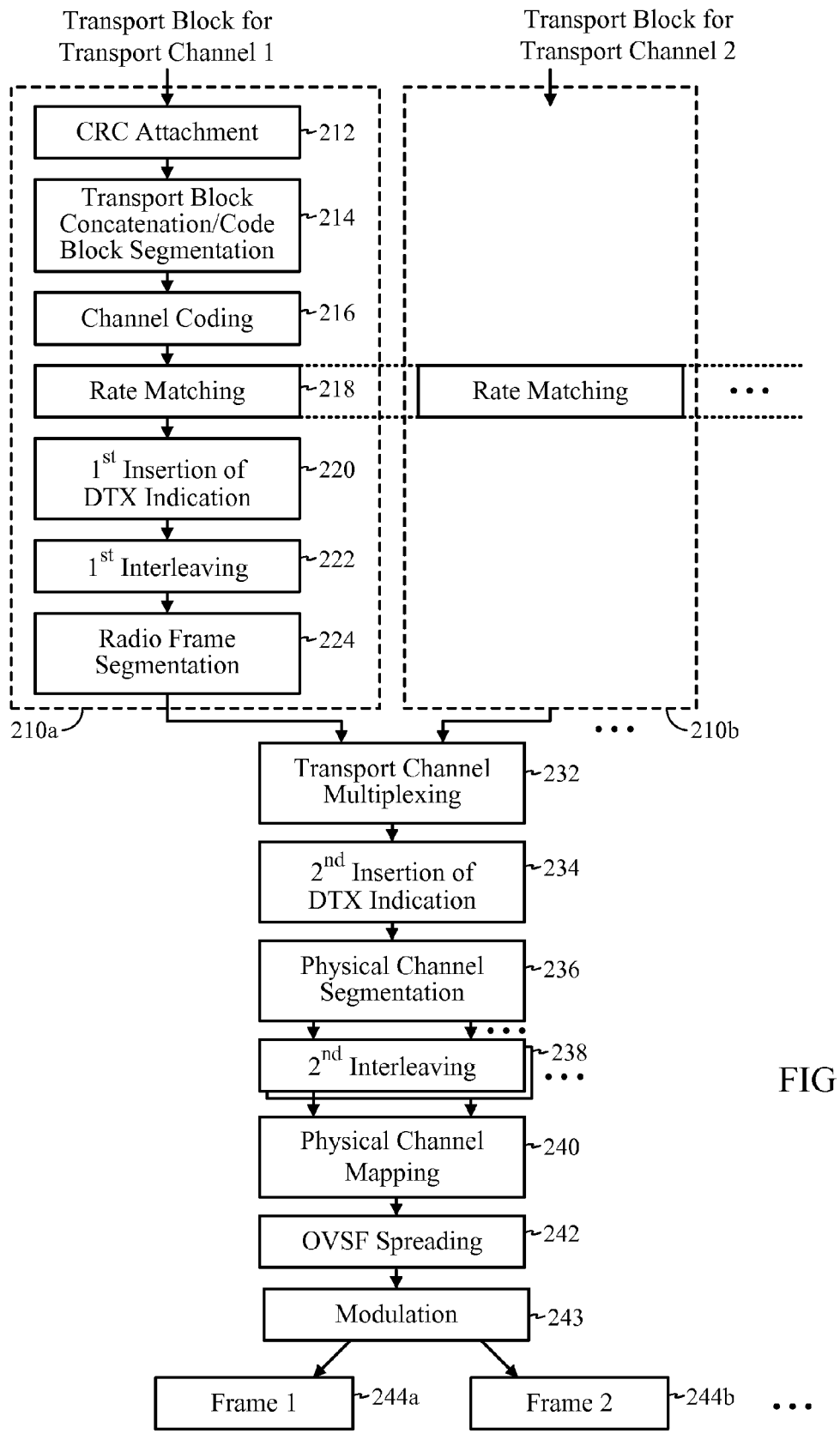
FIG. 2A is a diagram of the signal processing at a Node B for a downlink data transmission in accordance with the W-CDMA standard.

FIG. 2A is a diagram of the signal processing at a Node B for a downlink data transmission in accordance with the W-CDMA standard. While signal processing of the downlink is specifically described with reference to FIGS. 2A and 2B, corresponding processing performed on the uplink will be clear to one of ordinary skill in the art, and exemplary embodiments of the present disclosure in both the downlink and the uplink are contemplated to be within the scope of the present disclosure.

The upper signaling layers of a W-CDMA system support data transmission on one or more transport channels to a specific terminal, with each transport channel (TrCH) being capable of carrying data for one or more services. These services may include voice, video, packet data, and so on, which are collectively referred to herein as "data."

The data for each transport channel is processed based on one or more transport formats selected for that transport channel. Each transport format defines various processing parameters such as a transmission time interval (TTI) over which the transport format applies, the size of each transport block of data, the number of transport blocks within each TTI, the coding scheme to be used, and so on. The TTI may be specified as 10 milliseconds (ms), 20 ms, 40 ms, or 80 ms. Each TTI can be used to transmit a transport block set having a number of equal-sized transport blocks, as specified by the transport format for the TTI. For each transport channel, the transport format can dynamically change from TTI to TTI, and the set of transport formats that may be used for the transport channel is referred to as the transport format set.

As shown in FIG. 2A, the data for each transport channel is provided, in one or more transport blocks for each TTI, to a respective transport channel processing section 210. Within each processing section 210, each transport block is used to calculate a set of cyclic redundancy check (CRC) bits at block 212. The CRC bits are attached to the transport block and are used by a receiving terminal for block error detection. The one or more CRC coded blocks for each TTI are then serially concatenated together at block 214. If the total number of bits after concatenation is greater than the maximum size of a code block, then the bits are segmented into a number of (equal-sized) code blocks. The maximum code block size is determined by the particular coding scheme (e.g., convolutional, Turbo, or no coding) selected for use for the current TTI, which is specified by the transport format. Each code block is then coded with the selected coding scheme or not coded at all at block 216 to generate coded bits.

Rate matching is then performed on the coded bits in accordance with a rate-matching attribute assigned by higher signaling layers and specified by the transport format at block 218. On the uplink, bits are repeated or punctured (i.e., deleted) such that the number of bits to be transmitted matches the number of available bit positions. On the downlink, unused bit positions are filled with discontinuous transmission (DTX) bits at block 220. The DTX bits indicate when a transmission should be turned off and are not actually transmitted.

The rate-matched bits for each TTI are then interleaved in accordance with a particular interleaving scheme to provide time diversity at block 222. In accordance with the W-CDMA standard, the interleaving is performed over the TTI, which can be selected as 10 ms, 20 ms, 40 ms, or 80 ms. When the selected TTI is longer than 10 ms, the bits within the TTI are segmented and mapped onto consecutive transport channel frames at block 224. Each transport channel frame corresponds to the portion of the TTI that is to be transmitted over a (10 ms) physical channel radio frame period (or simply, a "frame").

In W-CDMA, data to be transmitted to a particular terminal is processed as one or more transport channels at a higher signaling layer. The transport channels are then mapped to one or more physical channels assigned to the terminal for a communication (e.g., a call). In W-CDMA, a downlink dedicated physical channel (downlink DPCH) is typically assigned to each terminal for the duration of a communication. The downlink DPCH is used to carry the transport channel data in a time-division multiplexed manner along with control data (e.g., pilot, power control information, and so on). The downlink DPCH may thus be viewed as a multiplex of a downlink dedicated physical data channel (DPDCH) and a downlink dedicated physical control channel (DPCCH), as described below. The transport channel data is mapped only to the DPDCH, while the DPCCH includes the physical layer signaling information.

The transport channel frames from all active transport channel processing sections 210 are serially multiplexed into a coded composite transport channel (CCTrCH) at block 232. DTX bits may then be inserted into the multiplexed radio frames such that the number of bits to be transmitted matches the number of available bit positions on one or more "physical channels" to be used for the data transmission at block 234. If more than one physical channel is used, then the bits are segmented among the physical channels at block 236. The bits in each frame for each physical channel are then further interleaved to provide additional time diversity at block 238. The interleaved bits are then mapped to the data portions (e.g., DPDCH) of their respective physical channels at block 240. The bits of the physical channel are spread using orthogonal variable spreading factor (OVSF) codes at block 242, modulated at block 243, and subsequently segmented into physical channel radio frames 244a, 244b, etc. It will be appreciated that the spreading factor (SF) employed may be chosen based on how many bits are to be transmitted in a frame.

Note in this specification and in the claims, a "composite channel" may be defined as any transmission (e.g., DPCH TX) that contains data multiplexed from two or more transport channels.

Figure 2B:
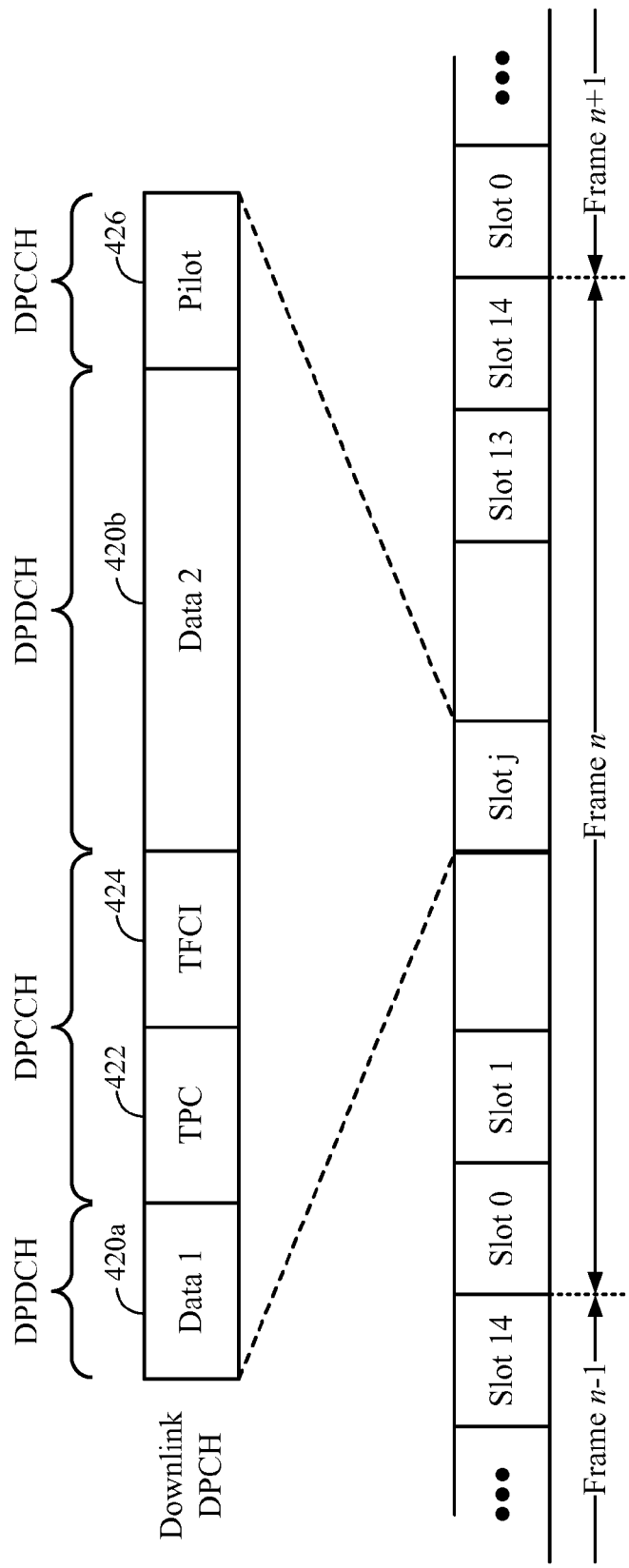
FIG. 2B is a diagram of a frame and slot format for the downlink data physical channel (DPCH), as defined by the W-CDMA standard.

FIG. 2B is a diagram of a frame and slot format for the downlink data physical channel (DPCH), as defined by the W-CDMA standard. The data to be transmitted on the downlink DPCH is partitioned into radio frames, with each radio frame being transmitted over a (10 ms) frame that comprises 15 slots labeled as slot 0 through slot 14. Each slot is further partitioned into a number of fields used to carry user-specific data, signaling, and pilot, or a combination thereof.

As shown in FIG. 2B, for the downlink DPCH, each slot includes data fields 420a and 420b (Data 1 and Data 2), a transmit power control (TPC) field 422, a transport format combination indicator (TFCI) field 424, and a pilot field 426. Data fields 420a and 420b are used to send user-specific data. The TPC field 422 is used to send power control information to direct the terminal to adjust its uplink transmit power either up or down to achieve the desired uplink performance while minimizing interference to other terminals. TFCI field 424 is used to send information indicative of the transport format of the downlink DPCH and a downlink shared channel DSCH, if any, assigned to the terminal. Pilot field 426 is used to send a dedicated pilot.

Figure 2C:
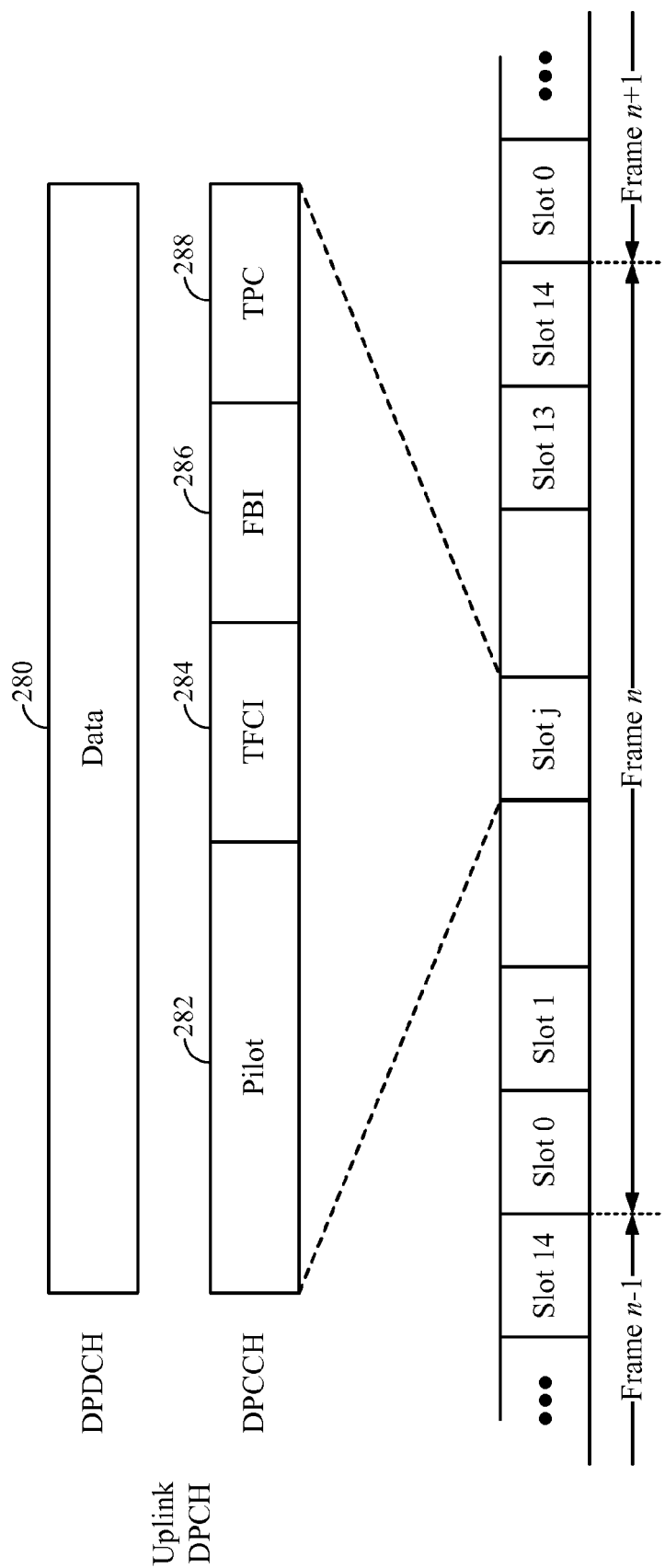
FIG. 2C is a diagram of a corresponding frame and slot format for the uplink data physical channel (DPCH), as defined by the W-CDMA standard.

FIG. 2C is a diagram of a corresponding frame and slot format for the uplink data physical channel (DPCH), as defined by the W-CDMA standard. As shown in FIG. 2C, for the uplink DPCH, each slot includes a data field 280 (Data), a pilot field 282, a transport format combination indicator (TFCI) field 284, a feedback information field (FBI) 286, and a transmit power control (TPC) field 288. FBI field 286 may support feedback for use in, e.g., closed-loop transmit diversity.

Figure 2D:
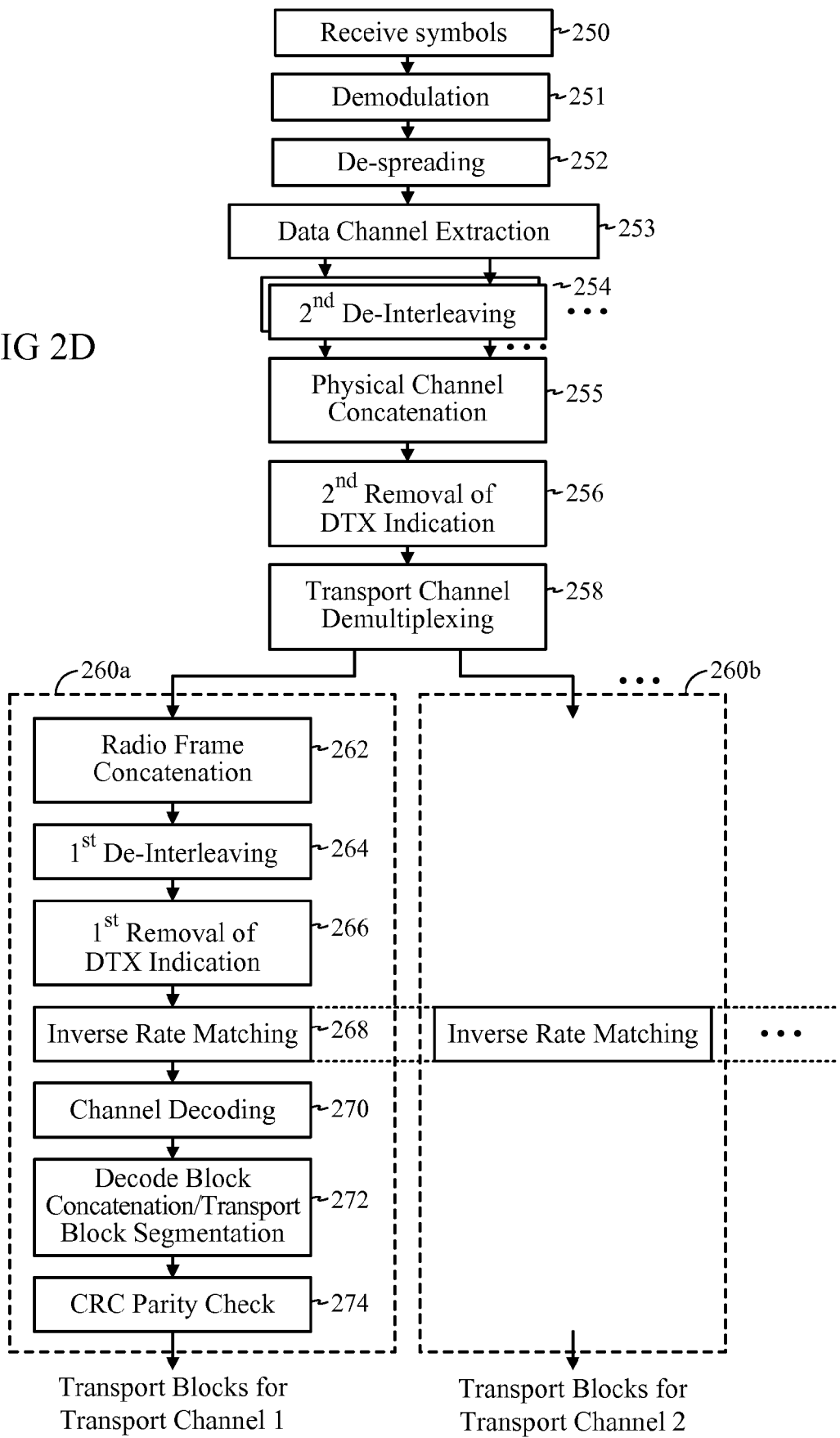
FIG. 2D is a diagram of signal processing that may be performed at a UE for downlink data reception, in accordance with the W-CDMA standard.

FIG. 2D is a diagram of signal processing that may be performed at a UE for downlink data reception, in accordance with the W-CDMA standard. One of ordinary skill in the art will appreciate that the techniques described may be readily modified to support signal processing at a Node B for the uplink transmission, in accordance with W-CDMA or any other standard.

The signal processing shown in FIG. 2D is complementary to that shown in FIG. 2A. Initially, the symbols for a physical channel radio frame may be received at block 250. The symbols are demodulated at block 251 and despread at block 252. Extraction of the symbols corresponding to the data channel is performed at block 253. The symbols of each frame for each physical channel are de-interleaved at block 254, and the de-interleaved symbols from all physical channels are concatenated at block 255. Removal of DTX bits is performed at block 256. The symbols are then demultiplexed into various transport channels at block 258. The radio frames for each transport channel are then provided to a respective transport channel processing section 260.

Within each transport channel processing section 260, the transport channel radio frames are concatenated into transport block sets at block 262. Each transport block set includes one or more transport channel radio frames depending on the respective TTI. The symbols within each transport block set are de-interleaved at block 264, and non-transmitted symbols are removed at block 266. Inverse rate matching (or de-rate matching) is then performed to accumulate repeated symbols and insert "erasures" for punctured symbols at block 268. Each coded block in the transport block set is then decoded at block 270, and the decoded blocks are concatenated and segmented into one or more transport blocks at block 272. Each transport block is then checked for error using the CRC bits attached to the transport block at block 274. For each transport channel, one or more decoded transport blocks are provided for each TTI. In certain prior art implementations, the decoding of coded blocks at block 270 may commence only after all physical channel radio frames of the corresponding TTI are received.

Figure 3:
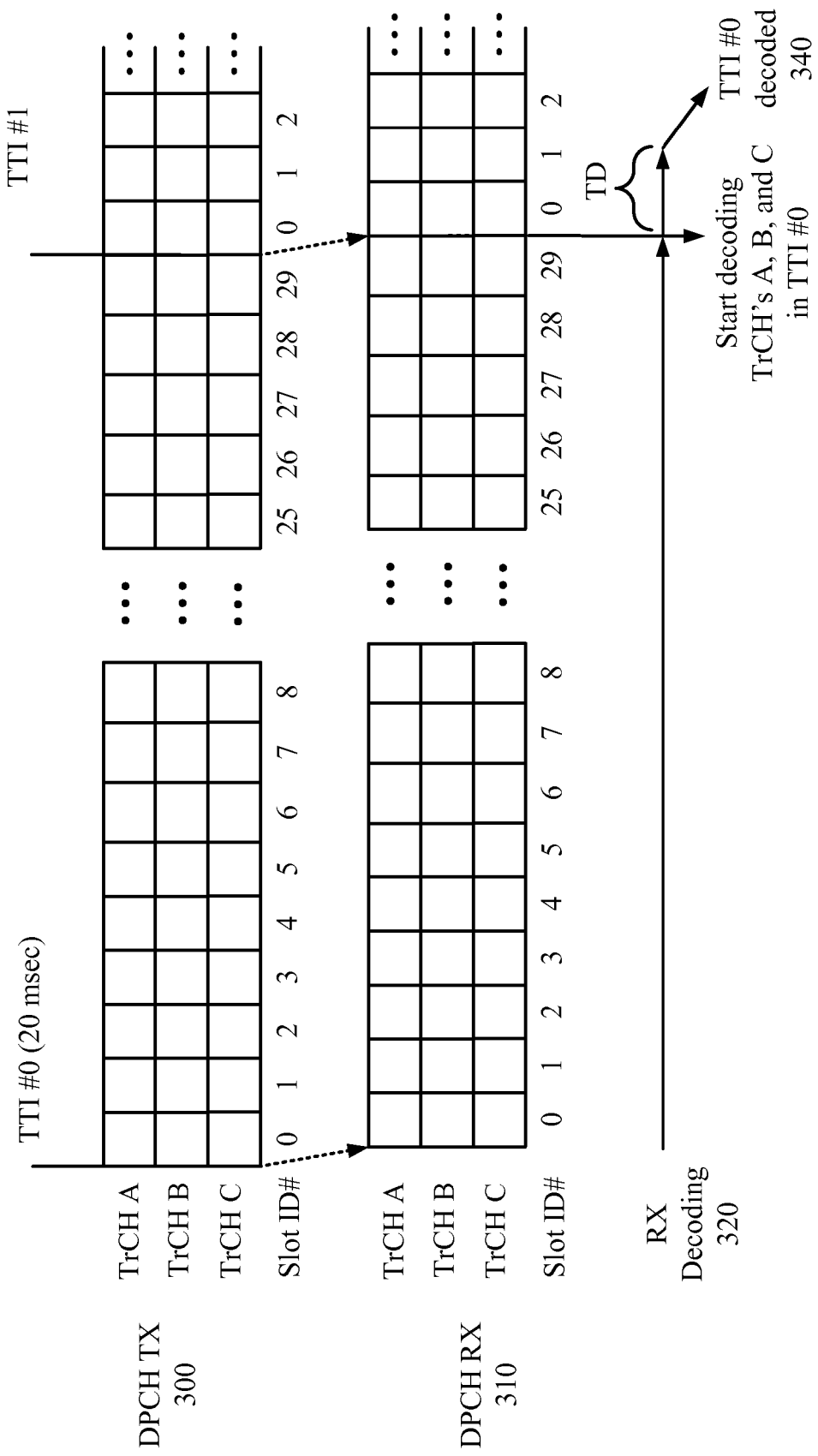
FIG. 3 illustrates timing diagrams associated with a prior art signaling scheme for W-CDMA.

FIG. 3 illustrates timing diagrams associated with a prior art signaling scheme for W-CDMA. It will be appreciated that the signaling scheme shown in FIG. 3 may describe either the downlink or the uplink.

In FIG. 3, DPCH slots of TrCH's A, B, and C are transmitted at 300. Each transport channel has a TTI of 20 ms, each spanning 30 slots, each slot having a slot identification number (slot ID#) 0 to 29. The slots of the DPCH are received at 310. In the prior art scheme, all 30 slots of a TTI are received before attempting to decode a corresponding transport channel. For example, slot ID#'s 0 through 29 of TTI #0 are received before attempting to decode any of TrCH's A, B, and C at 330. Following a decoding time TD, TrCH's A, B, and C are successfully decoded at 340. Note while decoding of TrCH's A, B, and C is performed, the transmitted symbols for TTI #1 may concurrently be received at the receiver.

In accordance with the present disclosure, early decoding and termination techniques for W-CDMA as described hereinbelow may allow a communications system to operate more efficiently and save transmission power, thereby increasing system capacity.

Figure 4:
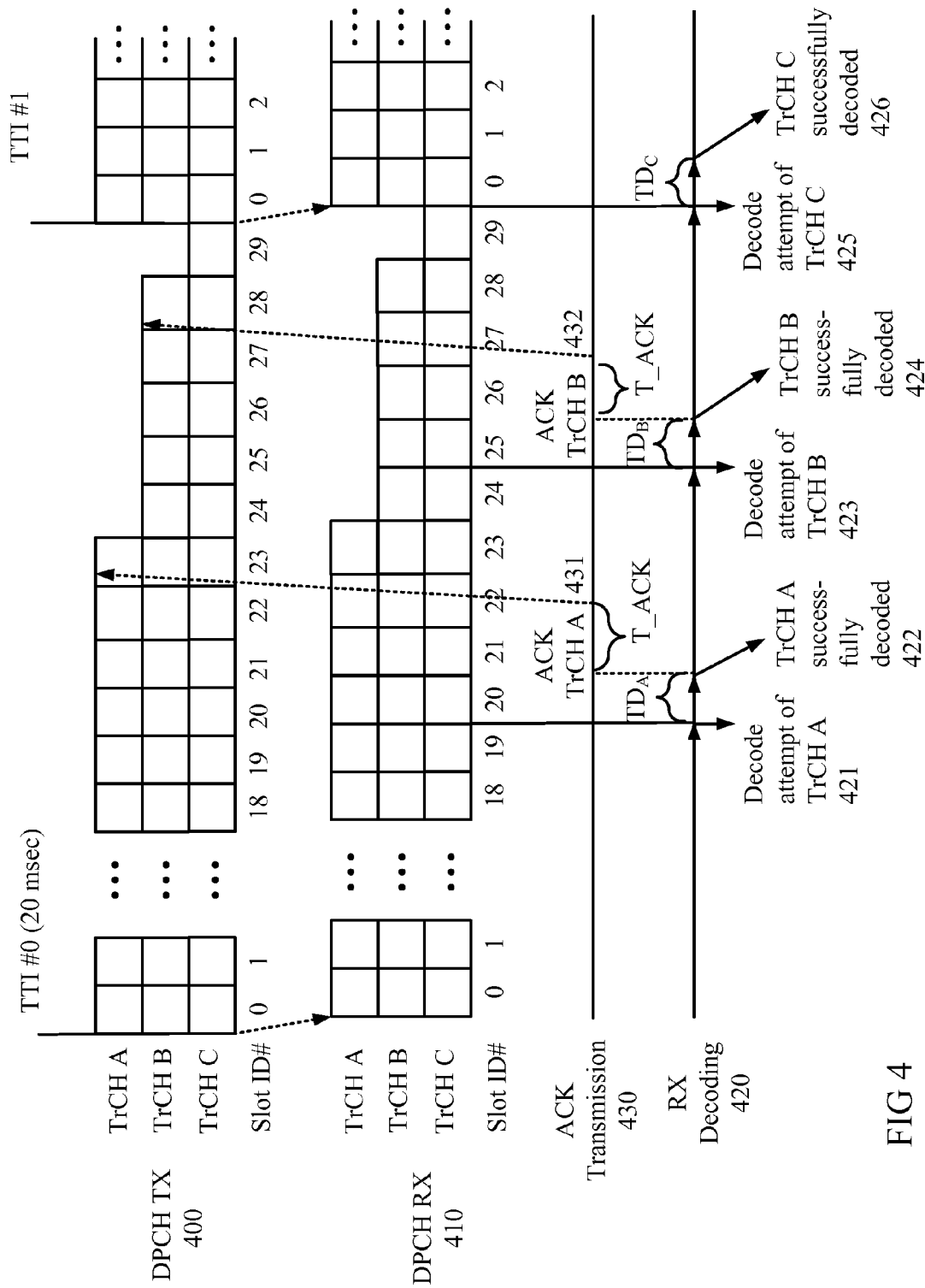
FIG. 4 illustrates an exemplary embodiment of a scheme for early termination of transmissions for systems operating according to the W-CDMA standard.

FIG. 4 illustrates an exemplary embodiment of a scheme for early termination of transmissions for systems operating according to the W-CDMA standard. Note the exemplary embodiment is shown for illustrative purposes only, and is not meant to limit the scope of the present disclosure to systems based on W-CDMA. One of ordinary skill in the art will also appreciate that specific parameters such as number and transport format of transport channels, slot or frame timings, slot intervals and timings at which decoding attempts are made, etc., are shown for illustrative purposes only, and are not meant to limit the scope of the present disclosure.

In FIG. 4, DPCH slots of TrCH's A, B, and C are transmitted at 400. The transmitted slots are received at 410 by a receiver. According to the present disclosure, not all slots of a TTI need to be received before attempting to decode a corresponding transport channel(s). For example, a decoding attempt of TrCH A of TTI #0 occurs at 421, after receiving slot ID#19 of TTI #0. Following a decoding time $TD_A$, TrCH A is successfully decoded at 422. Similarly, a decoding attempt of TrCH B occurs at 423, after receiving slot ID#24, and TrCH B is thereafter successfully decoded following a decoding time $TD_B$ at 424. A decoding attempt of TrCH C occurs at 425, after receiving slot ID#29, and TrCH C is thereafter successfully decoded following a decoding time $TD_C$. Note while specific time intervals are shown for $TD_A$, $TD_B$, and $TD_C$ in FIG. 4, it will be appreciated that the present techniques may be applied to accommodate any arbitrary decoding times.

It will be appreciated that while the slots received prior to the decoding attempts of both TrCH's A and B at 421 and 423 correspond to only a portion of the total slots for the entire TTI, "early" decoding of the entire TTI using only the received slots may nevertheless be attempted on TrCH's A and B. Such early decoding attempts may have a substantial chance of decoding success due to, e.g., redundancy in the received symbols introduced by fractional rate encoding and/or repetition, e.g., at blocks 216 and 218 of FIG. 2A, and/or time- or other-dimensional diversity achieved via interleaving at blocks 222 and 238 of FIG. 2A.

Returning to FIG. 4, following a time T_ACK after TrCH A is successfully decoded at 422, an acknowledgment message (ACK) for TrCH A is sent to the DPCH transmitting side (TX) at 431. In an exemplary embodiment, the ACK may serve to notify the DPCH TX that the corresponding transport channel has been correctly decoded based on the already transmitted slots, and that further transmission of the remaining slot(s) of the transport channel may be unnecessary. In the exemplary embodiment shown, after receiving the ACK for TrCH A, the DPCH TX terminates slot transmission of TrCH A for the remainder of TTI #0, starting with slot ID#24. Transmission of TrCH A recommences at the start of the next TTI, TTI #1. Similarly, the DPCH TX terminates slot transmission of TrCH B starting with slot ID#28 in response to receiving an ACK for TrCH B sent at 432, and recommences transmission of TrCH B at the start of the next TTI, TTI #1.

It will be appreciated that by terminating slot transmission for a transport channel prior to the end of a TTI, the potential interference to other users may be significantly reduced, thereby increasing system capacity.

One of ordinary skill in the art will appreciate that the total time from: a) receiving a slot at the DPCH RX designated for a decoding attempt, to b) sending an ACK to terminate transmissions at the DPCH TX, includes the time intervals $TD_A$ and T_ACK as described hereinabove, and may be determined by, e.g., the available computational resources for decoding. In an exemplary embodiment, such total time may be designed to be 3 slots.

In an exemplary embodiment, the time intervals separating decoding attempts for each transport channel may be chosen as a design parameter. For example, a decoding attempt for any particular transport channel may be made every one, two, or any number of slots. Alternatively, decoding attempts for any transport channel may be made aperiodically throughout the duration of the TTI. It will be appreciated that increasing the frequency of decoding attempts will generally increase the likelihood that a transport channel is decoded at the earliest possible opportunity, at the cost of greater required computational bandwidth. In an exemplary embodiment, decoding attempts of one or more transport channels may be performed every 3 slots, or 2 ms.

In an exemplary embodiment, decoding attempts of a transport channel may be offset in time from decoding attempts of another transport channel. For example, in FIG. 4, the decoding attempt of TrCH A is performed after receiving slot ID#19, while the decoding attempt of TrCH B is performed after receiving slot ID#24. This may advantageously allow a single decoder to be reused for decoding attempts of multiple transport channels, by serially allocating the use of the decoder in time to the two transport channels. In an alternative exemplary embodiment, if greater decoding resources (e.g., two or more independent Viterbi decoders) are available, decoding attempts of different transport channels may be performed in parallel, e.g., decoding attempts of two or more transport channels may be concurrently performed after receiving the same slot. Such exemplary embodiments are contemplated to be within the scope of the present disclosure.

In the exemplary embodiment shown, a separate ACK is sent for early termination of each transport channel. One of ordinary skill in the art will appreciate that alternatively, a single ACK may signal early termination of more than one transport channel, as agreed upon by transmitter and receiver. Such alternative exemplary embodiments are contemplated to be within the scope of the present disclosure.

It will be appreciated that ACK channels for individual transport channels may be multiplexed in time, e.g., using a DPCCH portion of a transmission from the DPCH RX 410 to the DPCH TX 400, or in code, e.g., by allocating a separate Walsh code for each transport channel. Possible ACK signaling mechanisms in W-CDMA are described later herein.

Figure 5:
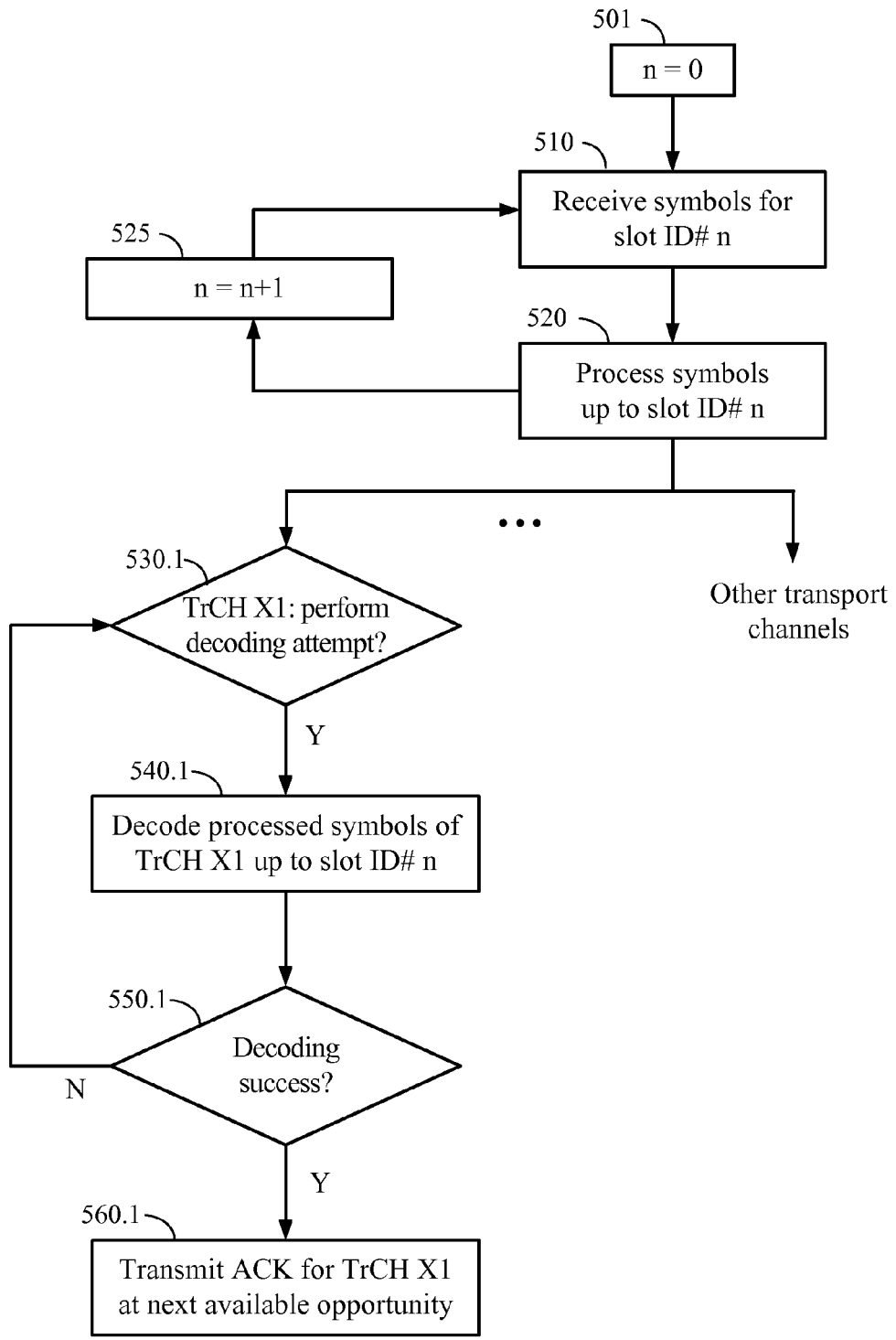
FIG. 5 illustrates an exemplary embodiment of an early decoding scheme for a TTI according to the present disclosure.

FIG. 5 illustrates an exemplary embodiment of an early decoding scheme for a TTI according to the present disclosure. Note FIG. 5 is shown for illustrative purposes only, and is not intended to restrict the scope of the present disclosure to any particular exemplary embodiments shown.

In FIG. 5, at block 501, a slot index n is initialized to n=0.

At block 510, symbols are received for slot ID# n.

At block 520, the symbols received up to slot ID# n are processed. In an exemplary embodiment, such processing may include blocks 252-258 as described with reference to FIG. 2D, e.g., de-spreading, second de-interleaving, transport channel de-multiplexing, etc. In an exemplary embodiment, such processing may further include transport channel-specific processing such as blocks 262-268 described with reference to FIG. 2D, e.g., first de-interleaving, inverse rate matching, etc.

Following block 520, n may be incremented at block 525, and reception of symbols for the next slot may proceed at block 510. Further following block 520, decoding attempts may be performed on a per-transport channel basis for one or more transport channels, as described with reference to blocks 530-560. One of ordinary skill in the art will appreciate that the techniques may be applied to any configuration of one or more transport channels.

At block 530.1, it is determined whether a decoding attempt should be performed for TrCH X1. If so, then operation proceeds to block 540.1. In an exemplary embodiment, the determination of whether decoding should be attempted may be based on the slot ID# of a slot that has been just received. For example, a decoding attempt for TrCH X1 may be made every 1, 2, or more slots starting with a first slot ID# x. Furthermore, decoding attempts for one transport channel may be offset from decoding attempts for other transport channels, as earlier described herein. Other schemes for determining whether decoding attempts should be performed will be clear to one of ordinary skill in the art in light of the present disclosure.

At block 540.1, decoding is performed for the symbols of TrCH X1 processed, e.g., at block 520, up to slot ID# n.

At block 550.1, it is determined whether the decoding performed at block 540.1 was a success. In an exemplary embodiment, decoding success may be determined based on whether a decoded CRC of one or more transport blocks of the transport channel is correctly verified. It will be appreciated that for transport channels having transport formats not specifying the use of a CRC, other metrics may be used to determine decoding success, e.g., an energy metric as computed by a decoder for the decoded block. If the decoding was a success, then operation proceeds to block 560.1, else operation returns to block 530.1.

At block 560.1, an ACK is transmitted for TrCH X1 at the next available opportunity. The mechanism for ACK transmission may utilize the techniques described hereinbelow with reference to FIGS. 6A, 6B, and 6C.

Figure 6A:
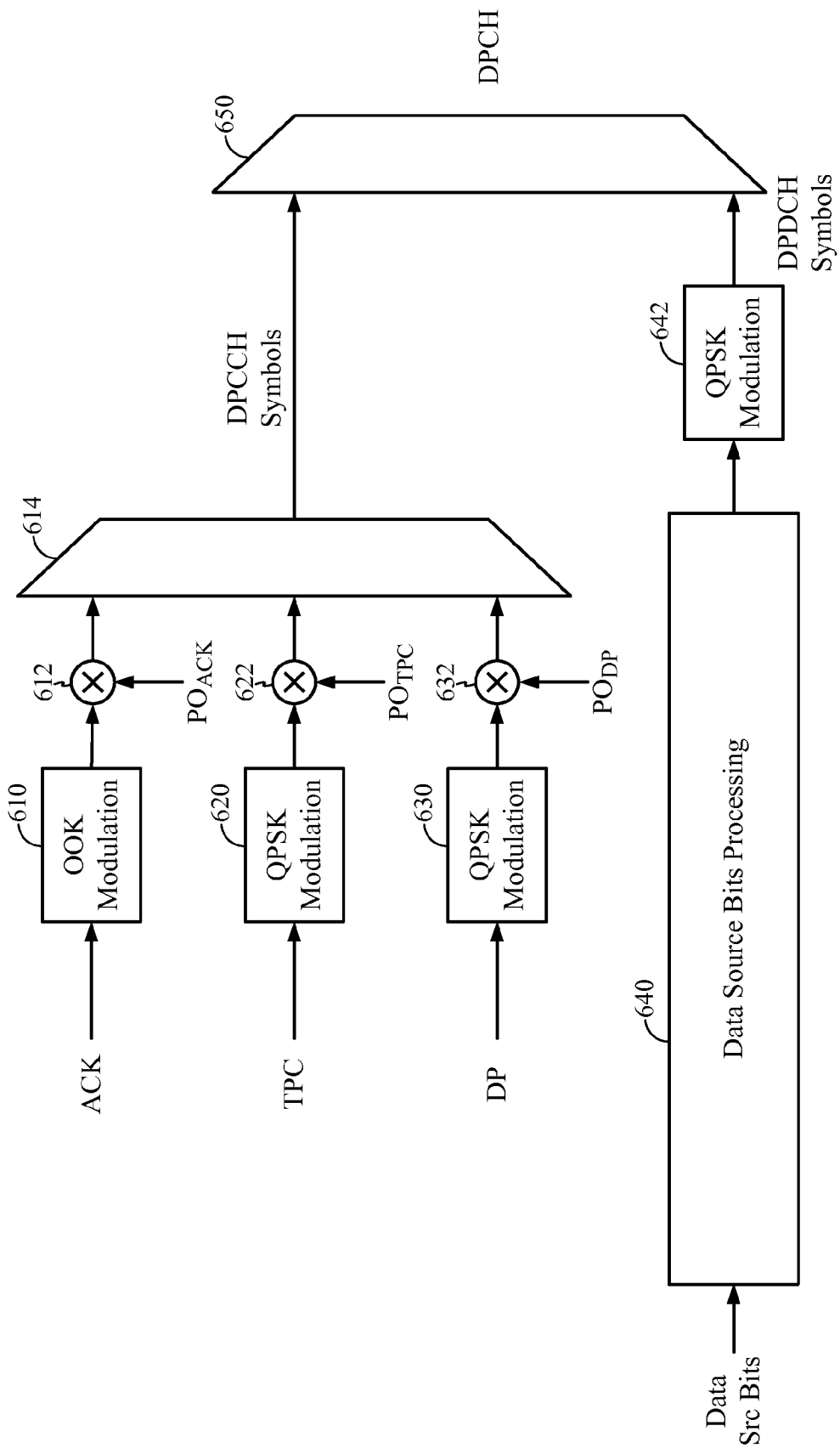
FIG. 6A illustrates an ACK signaling scheme for early termination according to the W-CDMA standard.

FIG. 6A illustrates an ACK signaling scheme for early termination according to the W-CDMA standard. In FIG. 6A, one or more ACK bits are provided to an on-off keying (OOK) modulation block 610. A power adjustment factor $PO_{ACK}$ is multiplied with the modulated ACK symbols at 612. One or more TPC bits are provided to a quadrature phase-shift keying (QPSK) block 620, and the modulated TPC symbols are multiplied by a power adjustment factor $PO_{TPC}$ at 622. Similarly, one or more pilot bits DP are provided to a QPSK block 630, and the modulated TPC symbols are multiplied by a power adjustment factor $PO_{DP}$ at 632. The power-adjusted symbols are provided to a multiplexing block 614, which outputs a waveform wherein the symbols are multiplexed to generate a DPCCH symbol stream. In exemplary embodiments, the symbols may be multiplexed in time, or code, etc.

It will be appreciated that in alternative exemplary embodiments, control bits not shown may also be processed and multiplexed onto the DPCCH symbol stream, e.g., TFCI bits, etc.

In FIG. 6A, data source bits are provided to a data source bits processing block 640. In an exemplary embodiment, block 640 may perform operations described with reference to blocks 212-242 of FIG. 2A. The processed bits are provided to a QPSK modulation block 642 to generate a DPDCH symbol stream. The DPCCH and DPDCH symbol streams are in turn multiplexed by a multiplexer 650 to generate the symbols for the DPCH.

In an exemplary embodiment, to accommodate the extra symbols for the ACK, the number of symbols allocated to the dedicated pilot bits DP may be correspondingly reduced, i.e., the ACK may be multiplexed with DP in time. To maintain a constant total energy allocated for the pilot DP, the power offset $PO_{DP}$ applied to DP may be correspondingly increased.

The scheme shown in FIG. 6A may be applied to downlink transmissions according to the W-CDMA standard. The ACK message shown may be transmitted by, e.g., a UE on an uplink, and received by a Node B on the uplink to terminate the Node B's downlink transmissions of one or more transport channels to the UE.

Figure 6B:
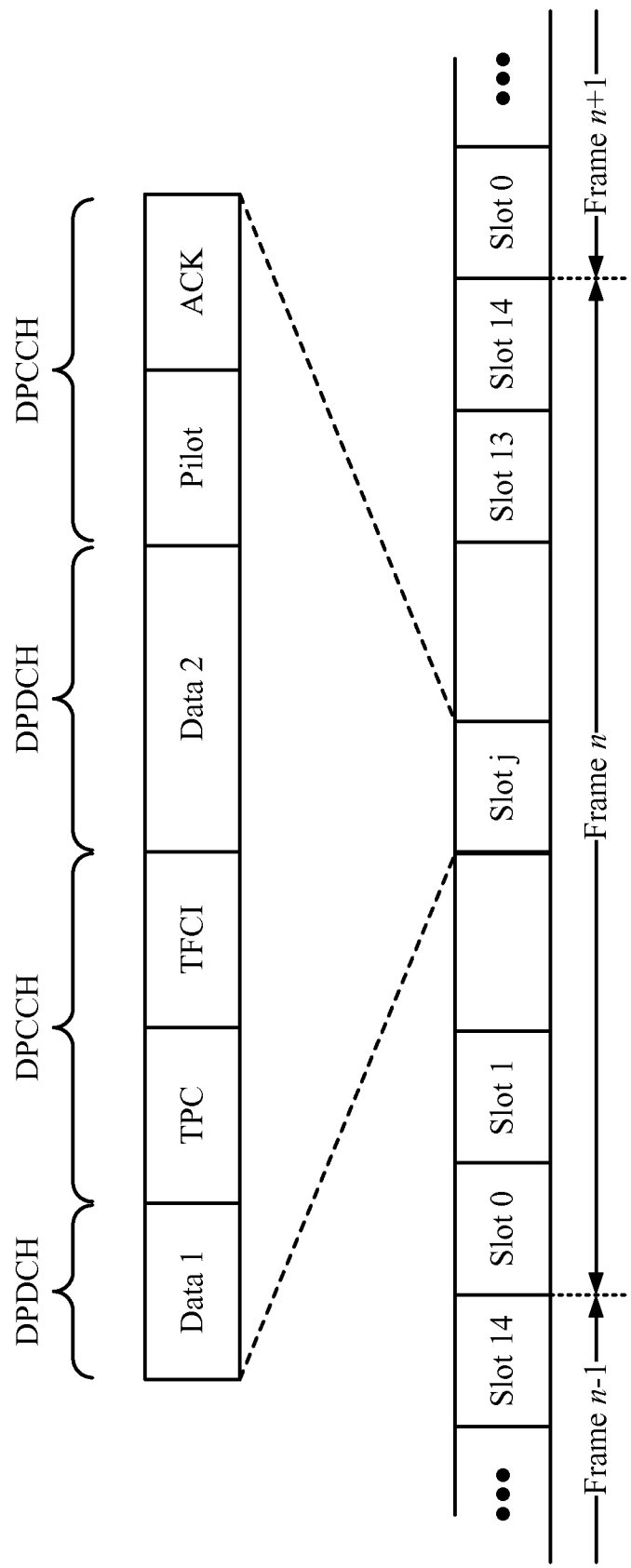
FIG. 6B illustrates an exemplary diagram of a frame and slot format for transmission of an ACK on the downlink in a W-CDMA system.

FIG. 6B illustrates an exemplary diagram of a frame and slot format for transmission of an ACK on the downlink in a W-CDMA system. The ACK transmission shown may be used on the downlink for early termination of uplink transmissions. In particular, the ACK is shown multiplexed in time with the pilot portion in the downlink DPCCH. In an exemplary embodiment, the power allotted to the ACK portion may be fixed at a predefined offset relative to, e.g., the pilot portion, to ensure a satisfactory error rate for ACK reception on the downlink.

In an alternative exemplary embodiment (not shown), the pilot portion may be omitted altogether, and the ACK may be provided in the time interval otherwise allocated to the pilot. Such alternative exemplary embodiments are contemplated to be within the scope of the present disclosure.

Figure 6C:
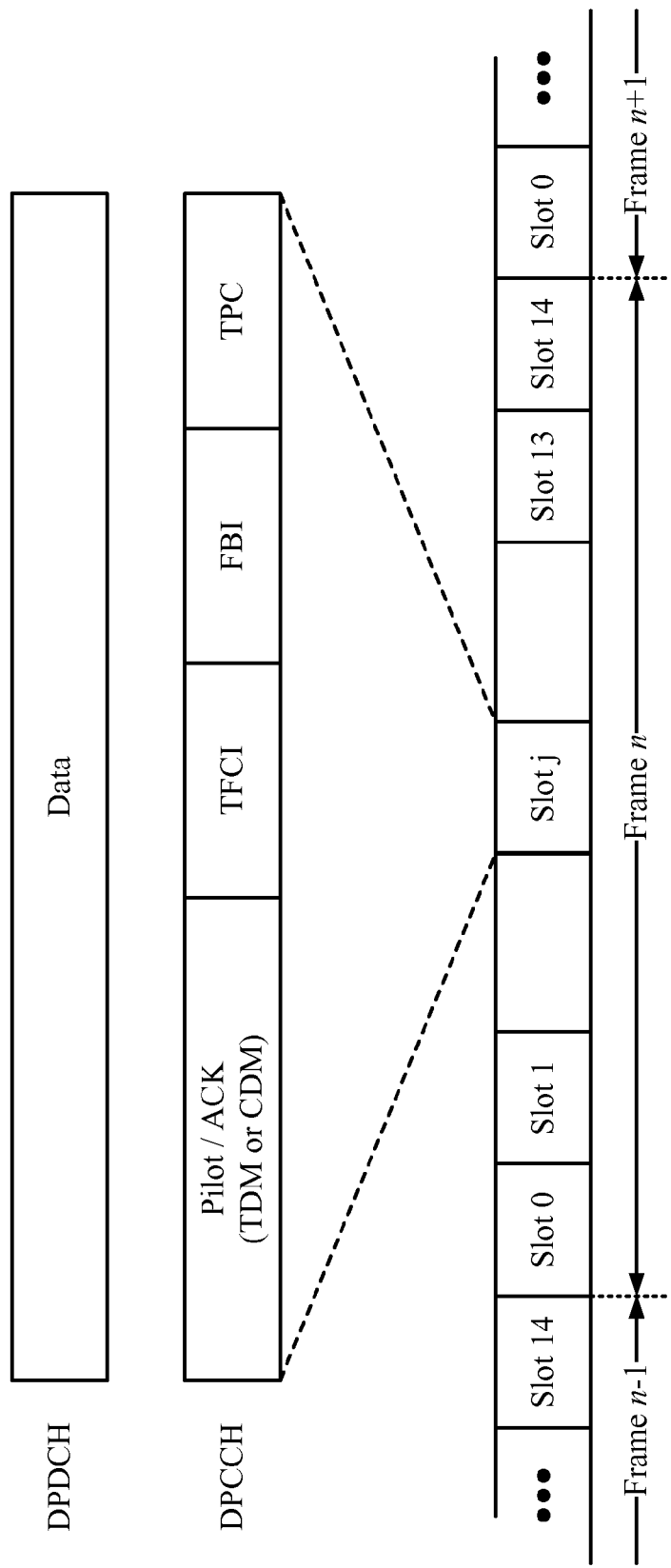
FIG. 6C illustrates an exemplary diagram of a frame and slot format for transmission of an ACK on the uplink in a W-CDMA system.

FIG. 6C illustrates an exemplary diagram of a frame and slot format for transmission of an ACK on the uplink in a W-CDMA system. The ACK transmission shown may be used for early termination of downlink transmissions. In particular, the ACK may again be multiplexed with the pilot, e.g., e.g., in time or in code, on the DPCCH of an uplink frame.

In alternative exemplary embodiments (not shown), an ACK may be separately provided on a separate channel independent of the DPCCH and DPDCH of an uplink frame. For example, a separate code channel may be assigned to an ACK. Furthermore, when multiple ACK's are provided for multiple transport channels, such multiple ACK's may be, e.g., multiplexed in code (by providing a separate code channel for each ACK) or multiplexed in time on a single code channel. Such alternative exemplary embodiments are contemplated to be within the scope of the present disclosure.

While specific exemplary embodiments have been described for accommodating ACK messaging in the present W-CDMA physical channel formats, one of ordinary skill in the art will appreciate that other exemplary embodiments are possible. In an alternative exemplary embodiment (not shown), any portion of the time intervals allocated to transmission of control symbols (on either uplink or downlink) may be replaced by ACK messaging symbols for any pre-designated slot or slots. The power allocated to such control symbols may be correspondingly upwardly adjusted to compensate for any decrease in total energy of the control symbols pilot due to the ACK messaging.

Figure 7:
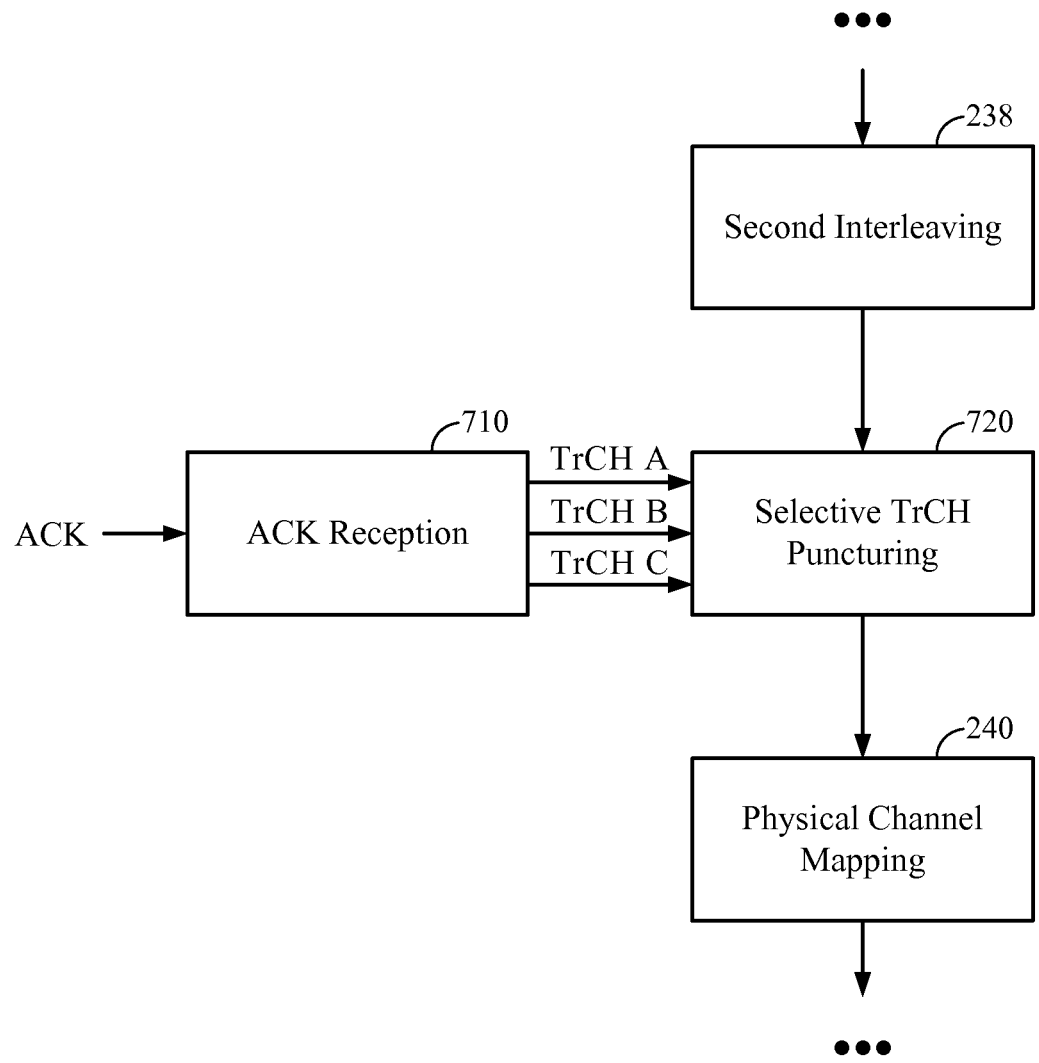
FIG. 7 illustrates an exemplary embodiment of processing performed at a Node B for early termination of downlink transmissions in response to receiving an ACK from the UE.

FIG. 7 illustrates an exemplary embodiment of processing performed at a Node B for early termination of downlink transmissions in response to receiving an ACK from the UE. One of ordinary skill in the art will appreciate that similar techniques may be adopted by the UE for early termination of uplink transmissions in response to receiving an ACK from the Node B. Such alternative exemplary embodiments are contemplated to be within the scope of the present disclosure.

In FIG. 7, an ACK reception module 710 at the Node B receives an ACK sent from a UE, wherein the ACK indicates that one or more of TrCH's A, B, and C have been correctly received by the UE. The ACK reception module 710 determines the transport channel that the ACK corresponds to, and signals those transport channels to a selective TrCH puncturing module 720. The selective TrCH puncturing module 720 is configured to puncture those bits corresponding to the acknowledged (ACK'ed) transport channels at the output of the second interleaving block 238. It will be appreciated that the process of puncturing may include replacing bits designated for transmission with "erasure" or "discontinuous transmission" (DTX) bits. The output stream of the selective puncturing module 720 is provided to the physical channel mapping block 240 for further downlink processing, as previously described herein with reference to FIG. 2A.

One of ordinary skill in the art will appreciate that the selective puncturing module 720 may be pre-programmed to identify which bits output by the second interleaving block 238 correspond to a particular transport channel, and may incorporate knowledge of, e.g., the first and second interleaving parameters, rate matching parameters, encoding, etc., of all the transport channels available.

Note in alternative exemplary embodiments, the ACK reception module 710 and the selective TrCH puncturing module 720 may readily be modified to accommodate fewer or more transport channels than shown in FIG. 7. Furthermore, the selective TrCH puncturing module 720 need not be provided after the second interleaver 710, and may instead be provided anywhere in the signal processing chain, as long as the bits corresponding to the particular TrCH ACK'ed are correctly selected. Such alternative exemplary embodiments are contemplated to be within the scope of the present disclosure.

In an exemplary embodiment, the early termination techniques described herein may be applied to voice communications using the adaptive multi-rate (AMR) speech codec according to the W-CDMA standard. In a voice communications system, a speech codec is often employed to encode a voice transmission using one of a plurality of variable encoding rates. The encoding rate may be selected based on, e.g., the amount of speech activity detected during a particular time interval. In W-CDMA, speech transmissions may be encoded using an adaptive multi-rate (AMR) codec, which encodes speech using one of a plurality of different bit rates or "AMR modes." In particular, the AMR codec may support any of a plurality of full-rate ("FULL") bit-rates ranging from 4.75 kbps (or kilobits per second) to 12.2 kbps, and for periods of silence, a silence indicator ("SID") bit-rate of 1.8 kbps, and frames of discontinuous transmission (DTX or "NULL") of 0 kbps.

It will be appreciated that full-rate AMR bits may be further partitioned into "class A bits" that are most sensitive to error, "class B bits" that are less sensitive to error, and "class C bits" that are least sensitive to error. In an exemplary embodiment, such class A, B, and C bits may be assigned to transport channels TrCH A, B, and C, respectively, for transmission over the air using the W-CDMA uplink or downlink interface. (See, e.g., the description of the W-CDMA downlink interface with reference to FIG. 2A hereinabove.) In an exemplary embodiment, the transport formats of TrCH A, B, and C may be defined such that class A bits are afforded the highest level of error protection (e.g., by setting encoding, CRC, and/or rate matching parameters), class B bits less error protection, and class C bits afforded the least error protection. In an exemplary embodiment, the TTI of each of the AMR transport formats may be defined as 20 ms.

Figure 8:
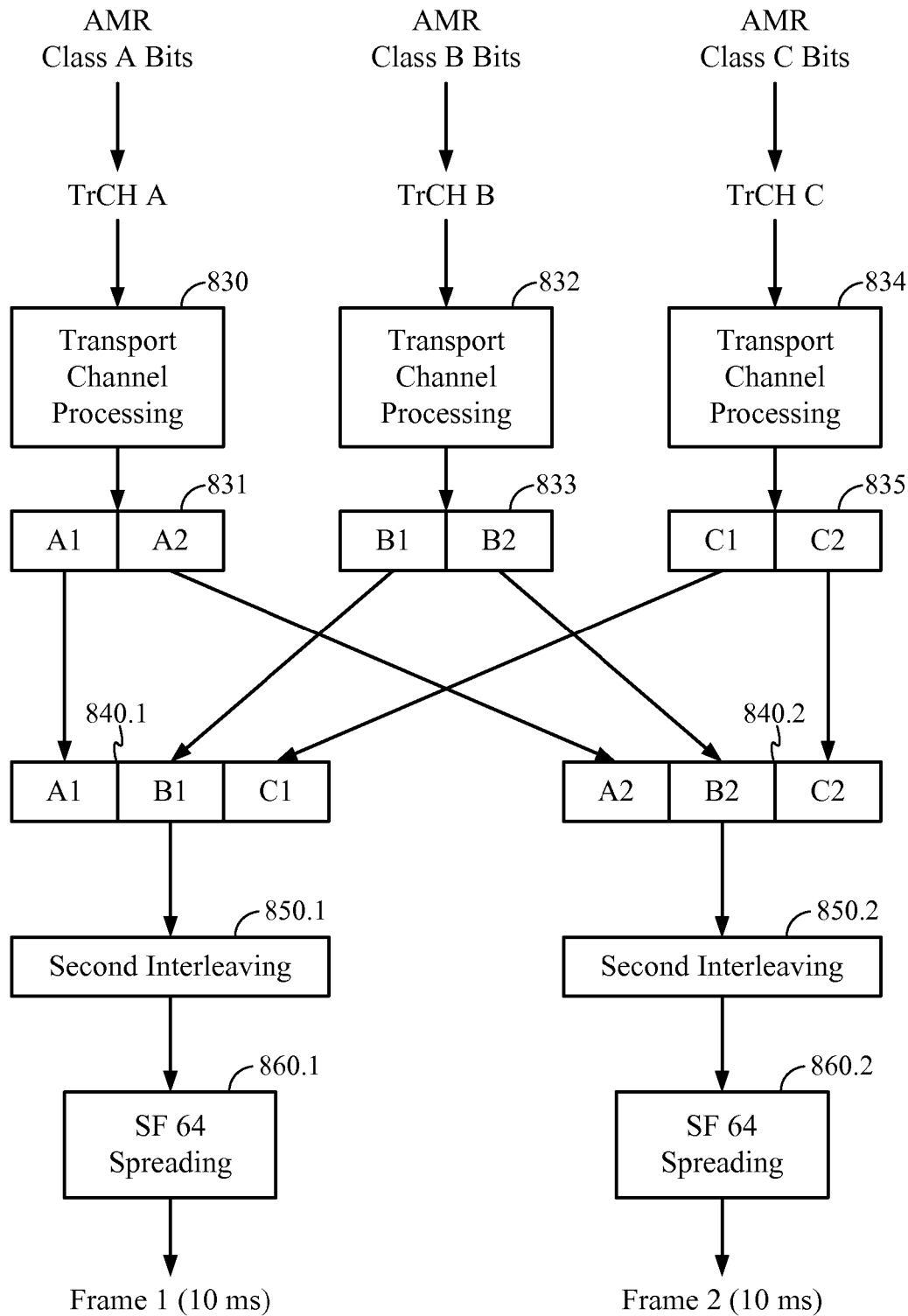
FIG. 8 illustrates a simplified diagram of a prior art scheme for transmission of a single full-rate AMR frame including class A, B, and C AMR bits over a W-CDMA interface.

FIG. 8 illustrates a simplified diagram of a prior art scheme for transmission of a single full-rate AMR frame including class A, B, and C AMR bits over a W-CDMA interface. It will be appreciated that, for ease of illustration, the processing shown in FIG. 8 omits certain details, e.g., the complete signal processing chain for TrCH's A, B, and C. In an exemplary embodiment, the schemes illustrated in FIGS. 8 and 9 may be applied on the uplink of a W-CDMA system.

In FIG. 8, the AMR class A, B, and C bits are assigned to transport channels A, B, and C, respectively. The bits of each transport channel are provided to corresponding transport channel processing blocks 830, 832, and 834. In an implementation, the transport format for transport channel A (corresponding to the AMR class A bits) specifies a 12-bit CRC for the transport blocks of TrCH A, while transport blocks TrCH's B and C do not contain CRC's.

Following blocks 830, 832, and 834, radio frame segmentation is performed at blocks 831, 833, and 835, respectively. For example, bits corresponding to AMR class A are segmented into a portion A1 for a first radio frame and A2 for a second radio frame, AMR class B bits are segmented into B1 and B2, and AMR class C bits are segmented into C1 and C2. The bits A1 are multiplexed with B1 and C1 to generate a CCTrCH 840.1, and the bits A2, B2, and C2 are likewise multiplexed to generate a CCTrCH 840.2. Second interleaving 850.1, 850.2 is separately performed for each of the CCTrCH's. The data for each frame is spread using a spreading factor of 64 at 860.1, 860.2 to generate frames 1 and 2.

In an implementation, per the W-CDMA standard, the uplink spreading factor is limited to at least 64.

According to the early decoding techniques described herein, the receiver may attempt early decoding on each of frames 1 and 2 generated according to the scheme shown in FIG. 8. In practice, the likelihood of successfully decoding a full two-frame TTI based on receiving only a first frame, e.g., after receiving 15 slots, may be quite low. Further disclosed herein are techniques to increase the likelihood of successfully decoding a full TTI at the earliest possible time.

Figure 9:
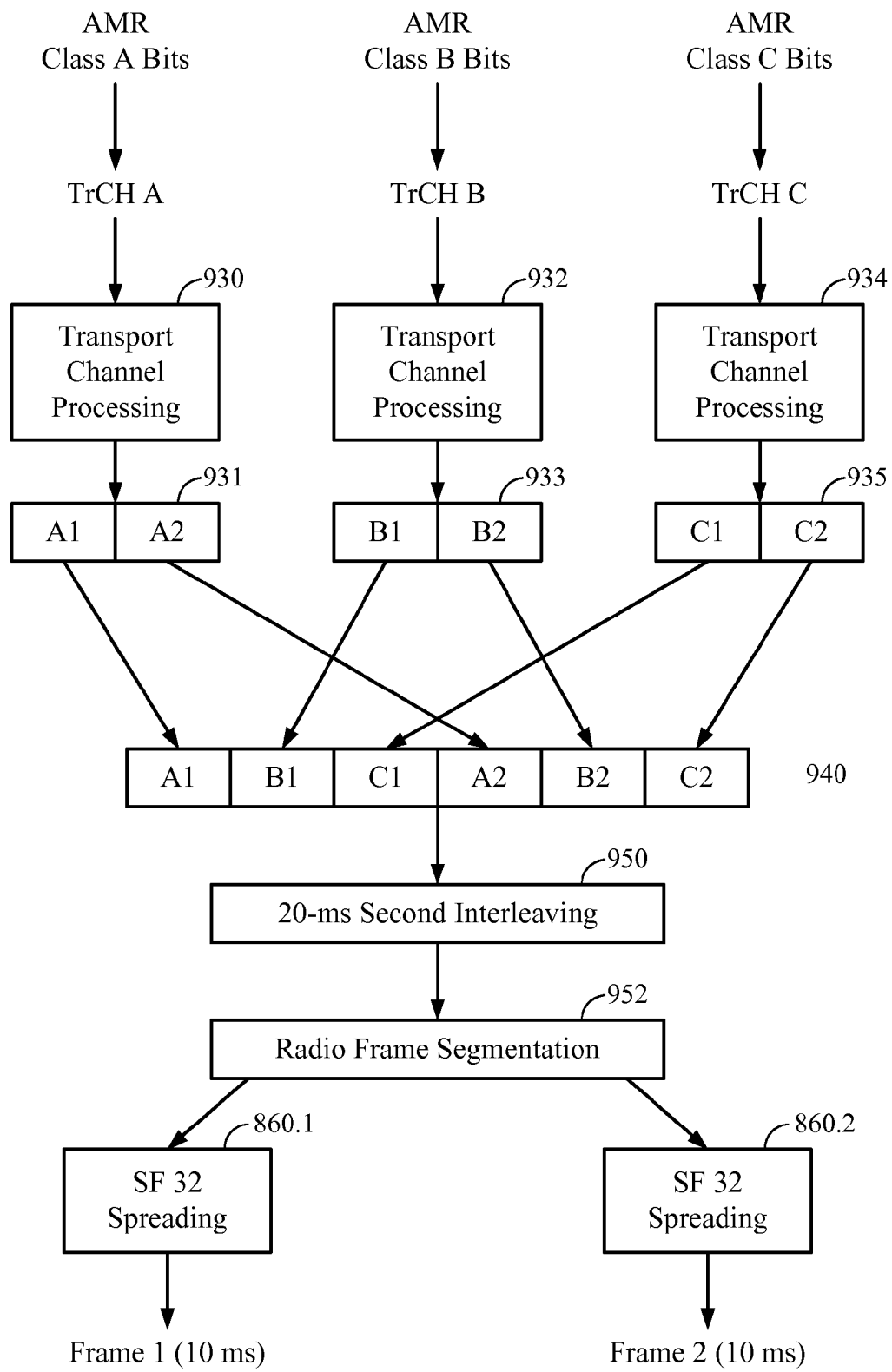
FIG. 9 illustrates an exemplary embodiment of a scheme for transmitting a full-rate AMR frame over a W-CDMA interface according to the present disclosure.

FIG. 9 illustrates an exemplary embodiment of a scheme for transmitting a full-rate AMR frame over a W-CDMA interface according to the present disclosure. In FIG. 9, AMR class A, B, and C bits are assigned to transport channels A, B, and C, respectively. The bits of each transport channel are provided to corresponding transport channel processing blocks 930, 932, and 934. In an exemplary embodiment, the coding rate of one or more transport channels may be reduced relative to the prior art scheme shown in FIG. 8, i.e., the number of coded symbols for each information symbol may be increased.

Following blocks 930, 932, and 934, segmentation is performed at blocks 931, 933, and 935, respectively, to generate bits A1, A2, B1, B2, C1, and C2 at 940. These bits are collectively provided to a 20-ms second interleaver 950. In an exemplary embodiment, the second interleaver 950 is modified from the prior art W-CDMA second interleaver 850 in that the second interleaver 950 is designed to interleave bits over 20 ms rather than 10 ms. This may advantageously distribute the encoded bits of each AMR class more uniformly over an entire TTI, thereby leading to greater likelihood of decoding one or more classes of the AMR bits at an earlier time.

Radio frame segmentation 952 is performed at the output of the 20-ms second interleaver 950 to separate the second-interleaved bits into first and second radio frames. The bits are spread at blocks 960.1 and 960.2. In an exemplary embodiment, the spreading at 960.1 and 960.2 is performed using a spreading factor less than the spreading factor employed at blocks 860.1 and 860.2 in the prior art AMR transmission scheme. It will be appreciated that reducing the spreading factor allows each frame to accommodate an increased number of bits resulting from, e.g., reducing the coding rate at transport channel processing blocks 930, 932, and 934, as earlier described herein. By simultaneously reducing the coding rate and spreading factor, and further introducing 20-ms second interleaving, it will be appreciated that the likelihood of successful decoding at an earlier time may be improved.

While FIG. 9 illustrates an exemplary embodiment wherein the reduction in coding rate and spreading factor is implemented in conjunction with 20-ms second interleaving, it will be appreciated that in alternative exemplary embodiments, the two features may be implemented separately. It will be further appreciated that the spreading factors referred to in FIGS. 8 and 9 are for illustrative purposes only. In alternative exemplary embodiments, other spreading factors may be readily employed, and such alternative exemplary embodiments are contemplated to be within the scope of the present disclosure.

In an exemplary embodiment, early decoding of TrCH's A, B, and C corresponding to AMR classes A, B, and C may proceed as earlier described herein with reference to FIG. 4. In particular, several options exist for coordinating the early decoding attempts of the multiple transport channels, some of which are explicitly described as follows for illustrative purposes.

In a first exemplary embodiment (also referred to herein as "ET-A"), early decoding of the AMR class A bits may be attempted every 3 slots, or 2 ms, starting with any slot received. Once the class A bits are successfully decoded, e.g., based on CRC check, an ACK for TrCH A may be sent, and transmission of class A bits may be terminated. AMR class B and C bits may continue to be transmitted until the end of the TTI.

In a second exemplary embodiment (also referred to herein as "ET-A-B"), the transport formats of TrCH's A and B, corresponding to AMR class A and class B, may both specify inclusion of a CRC, and thus early decoding may be attempted on both TrCH's A and B. In certain exemplary embodiments, early decoding attempts of TrCH A may be offset in time from early decoding attempts of TrCH B. Alternatively, decoding attempts of TrCH's A and B may be concurrently performed at a receiver after receiving the same slot.

Note while an exemplary embodiment has been described with reference to FIG. 9 wherein AMR class A, B, and C bits are assigned to TrCH's A, B, and C, respectively, alternative exemplary embodiments may employ alternative assignments of AMR classes to transport channels. In a third exemplary embodiment (also referred to herein as "ET-AB"), AMR class A and B bits may be assigned to a single transport channel, e.g., TrCH A, while AMR class C bits may be assigned to a separate transport channel, e.g., TrCH B. In this case, early decoding and termination of TrCH A would result in early termination of both AMR class A and B bits. Such alternative exemplary embodiments are contemplated to be within the scope of the present disclosure.

In an alternative exemplary embodiment, to further reduce the power required to transmit certain ARM classes over the W-CDMA interface, a transport format supporting a tail-biting convolutional coding scheme known in the art may be added to those already supported by the W-CDMA standard. It will be appreciated that a tail-biting convolutional code allows the tail bits associated with the convolutional code to be omitted by pre-loading the initial state of the convolutional code shift register with the expected ending state, thereby decreasing the overhead number of bits.

Figure 10:
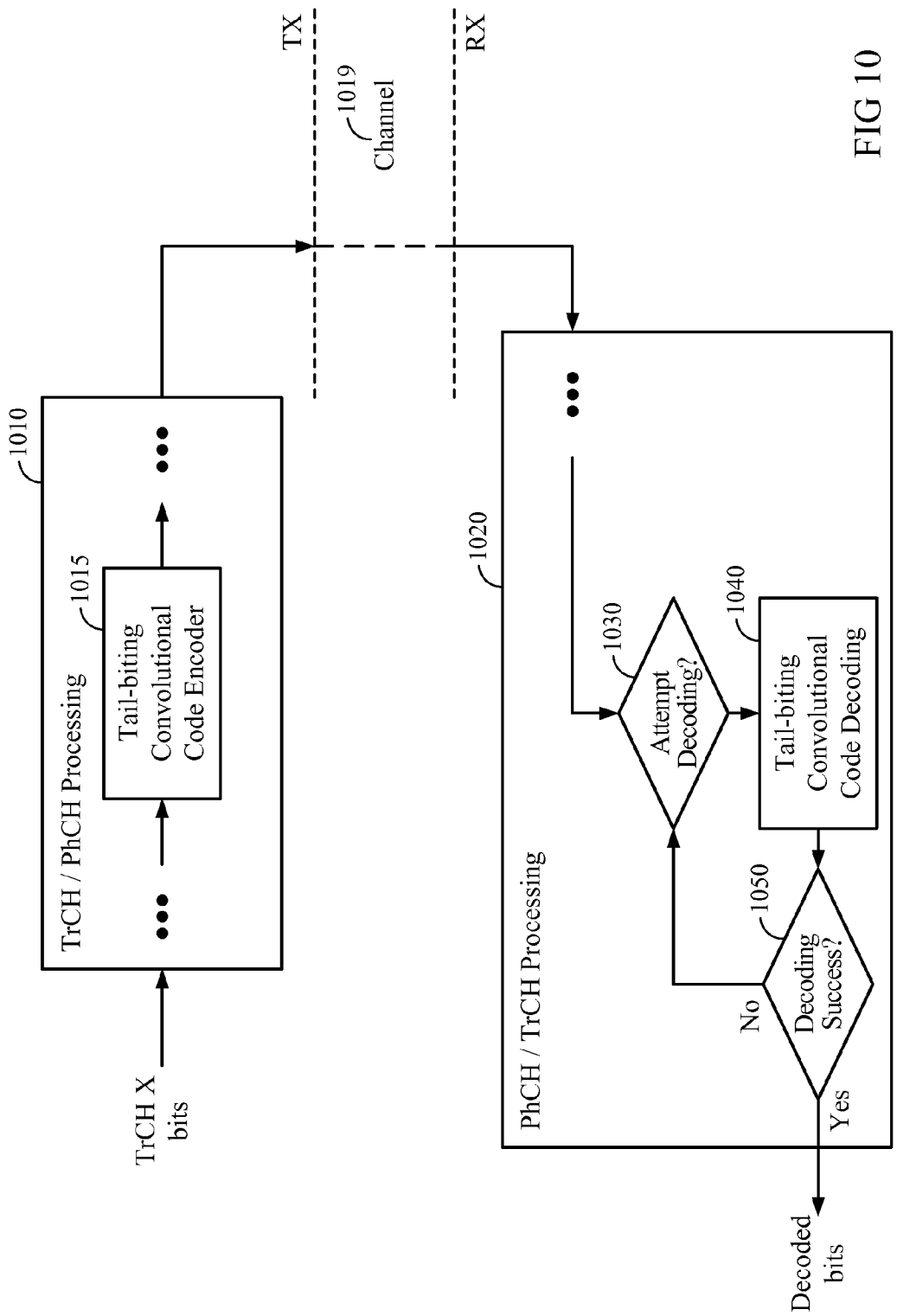
FIG. 10 illustrates an exemplary embodiment of a system employing a tail-biting convolutional code.

FIG. 10 illustrates an exemplary embodiment of a system employing a tail-biting convolutional code. In FIG. 10, bits for a TrCH X are provided to a TrCH/PhCH processing block 1010. Block 1010 may encode the TrCH X bits using a tail-biting convolutional code encoder 1015. For example, the tail-biting convolutional code encoder 1015 may be provided as the channel coding block 216 in FIG. 2.

Following block 1010, a signal is transmitted over the channel 1019, and provided to PhCH/TrCH processing block 1020. Block 1020 includes a block 1030 that determines whether early decoding should be attempted based on the current slot received. If so, the received symbols are provided to the tail-biting convolutional code decoder 1040, which implements any of a variety of tail-biting convolutional code decoding schemes known in the art. At block 1050, it is determined whether the decoding is successful. If yes, the TTI is declared successfully declared, and the decoded bits are provided. If no, then operation returns to block 1030 to wait for the next early decoding opportunity.

It will be appreciated that by omitting the tail bits associated with a conventional convolutional code, less data needs to be transmitted over the channel in the case of a tail-biting convolutional code, thereby generating less interference to other users. It will be further appreciated that repeated early decoding attempts of a tail-biting convolutional code may take advantage of the fact that the ending state of a previous early decoding attempt is expected to be equal to the initial state of a subsequent early decoding attempt of the same transport channel, thereby potentially saving computational resources.

In an exemplary embodiment, a transport format for one or more classes of AMR bits may specify that a tail-biting convolutional code be used to encode the class of bits. For example, in an exemplary embodiment (also referred to herein as "ET-A-B-TB"), the transport formats of TrCH A for AMR class A bits and TrCH B for AMR class B bits may both specify the inclusion of a CRC, while the transport formats of TrCH B and TrCH C for AMR class C bits may both specify that a tail-biting convolutional code be used for the encoding scheme. At the receiver, early decoding may be attempted on TrCH A and TrCH B according to the principles earlier described. In an alternative exemplary embodiment (also referred to herein as "ET-A-B-TB-Mod"), only the transport format of TrCH C for AMR class C bits may specify that a tail-biting convolutional code be used for the encoding scheme.

One of ordinary skill in the art will appreciate that the combinations of the transport formats described are given for illustrative purposes only, and that alternative exemplary embodiments may readily employ other combinations of the features described for transmission of the AMR bits according to the W-CDMA standard. Such alternative exemplary embodiments are contemplated to be within the scope of the present disclosure.

In an exemplary embodiment, the number of source bits for each transport channel, the number of CRC bits, and the number of tail bits for various AMR transmission techniques described herein may be chosen as follows (Table 1):

|  | Number of Source bits (AMR class) | Number of CRC bits | Number of tail bits |
|---|---|---|---|
| Baseline and ET-A | 81 (A) | 12 | 8 |
|  | 103 (B) | 0 | 8 |
|  | 60 (C) | 0 | 8 |
| ET-AB | 184 (AB) | 16 | 8 |
|  | 60 (C) | 0 | 8 |
| ET-A-B | 81 (A) | 12 | 8 |
|  | 103 (B) | 12 | 8 |
|  | 60 (C) | 0 | 8 |
| ET-A-B-TB | 81 (A) | 12 | 8 |
|  | 103 (B) | 12 | 0 |
|  | 60 (C) | 0 | 0 |
| ET-A-B-TB-Mod | 81 (A) | 12 | 8 |
|  | 103 (B) | 12 | 8 |
|  | 60 (C) | 0 | 0 |

In an exemplary embodiment, to further reduce transmission power in the system, the DPDCH portion of an AMR NULL packet may be entirely blanked, or inserted with DTX bits, on either the downlink or the uplink. In this case, no decoding would be performed at the receiver on such NULL packets. In conjunction therewith, outer-loop power control (OLPC) schemes at the receiver may be based only on received AMR FULL and SID packets, e.g., an OLPC scheme is not updated when an AMR NULL packet is received.

In an alternative exemplary embodiment, in conjunction with the early termination techniques described herein, the power control rate of the downlink or uplink may be further reduced. For example, rather than sending a power control command (e.g., in a TPC field of a slot) in every slot, a power control command may be sent once every two or more slots. In an exemplary embodiment, the DPCCH portion of an AMR NULL packet on the uplink may be gated according to a gating pattern determined by a power control rate on the downlink. For example, when 750 Hz power control is applied on the downlink, the uplink DPCCH may be gated (i.e., selectively turned off) once every other slot when transmitting AMR NULL packets. In alternative exemplary embodiments, if the power control rate of the downlink is even further slowed down when transmitting AMR NULL packets (e.g., <750 Hz), then the uplink DPCCH may be gated even more frequently (e.g., uplink DPCCH may be turned on only once every four or five slots). It will be appreciated that further considerations affecting how often the DPCCH may be gated include how reliably the uplink searcher can function, how reliably the uplink overhead channels can be decoded, and the configuration of the power control bit transmission waveforms on the uplink. Such exemplary embodiments are contemplated to be within the scope of the present disclosure.

Further described herein with reference to FIGS. 11A-11D is an example radio network operating according to UMTS in which the principles of the present disclosure may be applied. Note FIGS. 11A-11D are shown for illustrative background purposes only, and are not meant to limit the scope of the present disclosure to radio networks operating according to UMTS.

Figure 11A:
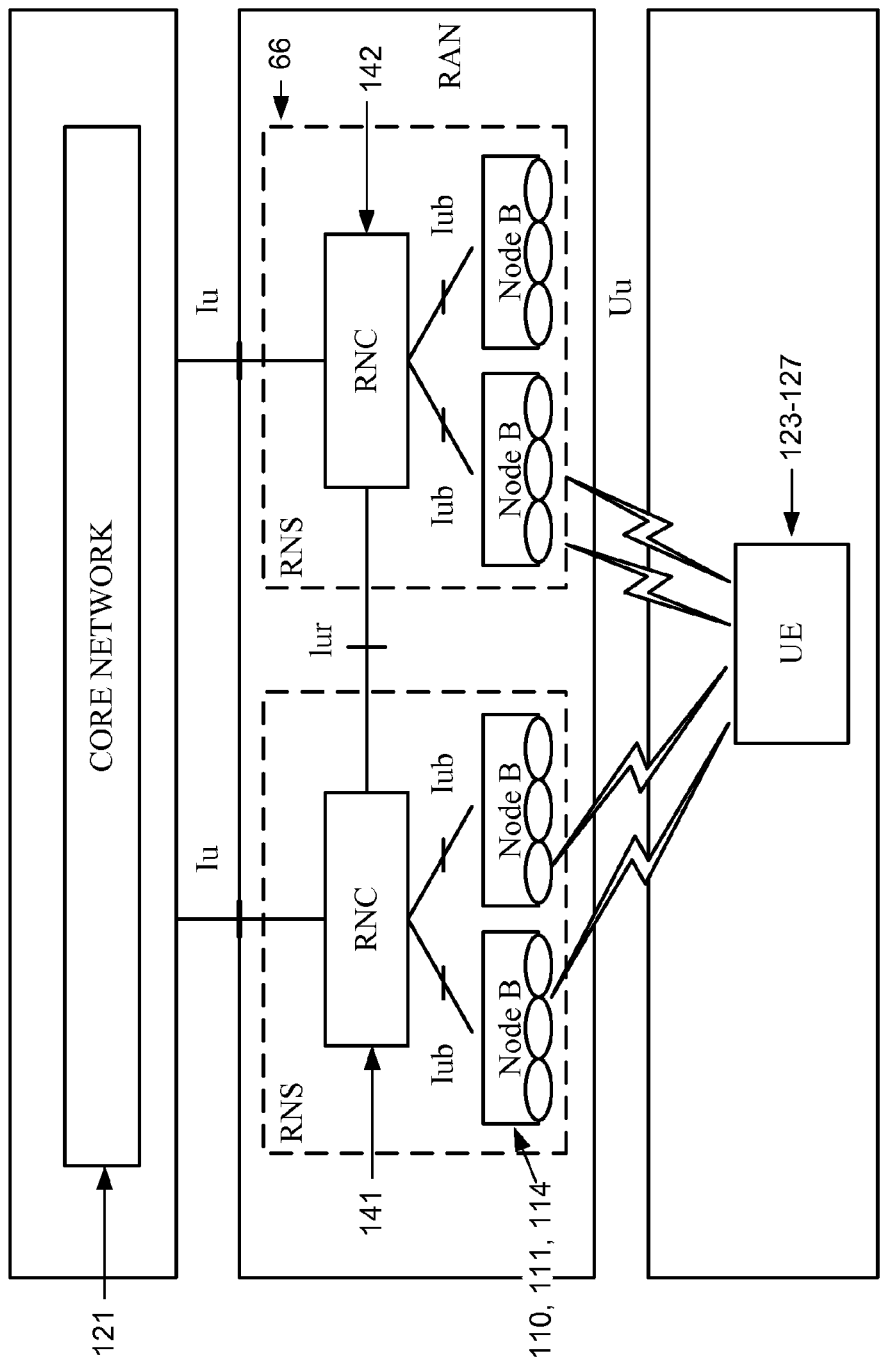
FIGS. 11A-11D describe an example radio network operating according to UMTS in which the principles of the present disclosure may be applied.

FIG. 11A illustrates an example of a radio network. In FIG. 11A, Node Bs 110, 111, 114 and radio network controllers 141-144 are parts of a network called "radio network," "RN," "access network," or "AN." The radio network may be a UMTS Terrestrial Radio Access Network (UTRAN). A UMTS Terrestrial Radio Access Network (UTRAN) is a collective term for the Node Bs (or base stations) and the control equipment for the Node Bs (or radio network controllers (RNC)) it contains which make up the UMTS radio access network. This is a 3 G communications network which can carry both real-time circuit-switched and IP-based packet-switched traffic types. The UTRAN provides an air interface access method for the user equipment (UE) 123-127. Connectivity is provided between the UE and the core network by the UTRAN. The radio network may transport data packets between multiple user equipment devices 123-127.

The UTRAN is connected internally or externally to other functional entities by four interfaces: Iu, Uu, Iub and Iur. The UTRAN is attached to a GSM core network 121 via an external interface called Iu. Radio network controllers (RNC's) 141-144 (shown in FIG. 11B), of which 141, 142 are shown in FIG. 11A, support this interface. In addition, the RNC manages a set of base stations called Node Bs through interfaces labeled Iub. The Iur interface connects two RNCs 141, 142 with each other. The UTRAN is largely autonomous from the core network 121 since the RNCs 141-144 are interconnected by the Iur interface. FIG. 11A discloses a communication system which uses the RNC, the Node Bs and the Iu and Uu interfaces. The Uu is also external and connects the Node B with the UE, while the Iub is an internal interface connecting the RNC with the Node B.

The radio network may be further connected to additional networks outside the radio network, such as a corporate intranet, the Internet, or a conventional public switched telephone network as stated above, and may transport data packets between each user equipment device 123-127 and such outside networks.

Figure 11B:
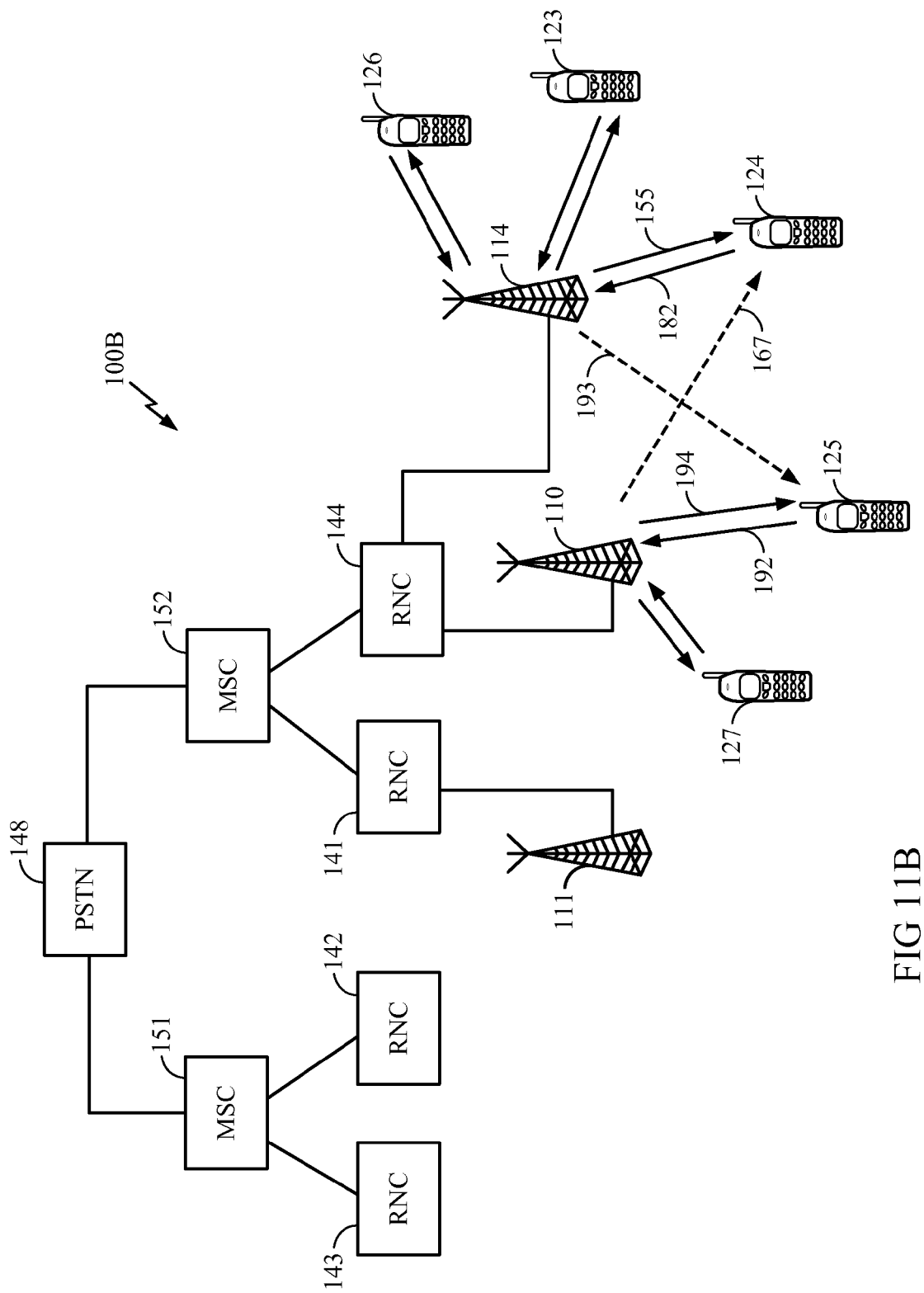

FIG. 11B illustrates selected components of a communication network 100B, which includes a radio network controller (RNC) (or base station controller (BSC)) 141-144 coupled to Node Bs (or base stations or wireless base transceiver stations) 110, 111, and 114. The Node Bs 110, 111, 114 communicate with user equipment (or remote stations) 123-127 through corresponding wireless connections 155, 167, 182, 192, 193, 194. The RNC 141-144 provides control functionalities for one or more Node Bs. The radio network controller 141-144 is coupled to a public switched telephone network (PSTN) 148 through a mobile switching center (MSC) 151, 152. In another example, the radio network controller 141-144 is coupled to a packet switched network (PSN) (not shown) through a packet data server node ("PDSN") (not shown). Data interchange between various network elements, such as the radio network controller 141-144 and a packet data server node, can be implemented using any number of protocols, for example, the Internet Protocol ("IP"), an asynchronous transfer mode ("ATM") protocol, T1, E1, frame relay, and other protocols.

The RNC fills multiple roles. First, it may control the admission of new mobiles or services attempting to use the Node B. Second, from the Node B, or base station, point of view, the RNC is a controlling RNC. Controlling admission ensures that mobiles are allocated radio resources (bandwidth and signal/noise ratio) up to what the network has available. It is where the Node B's Iub interface terminates. From the UE, or mobile, point of view, the RNC acts as a serving RNC in which it terminates the mobile's link layer communications. From a core network point of view, the serving RNC terminates the Iu for the UE. The serving RNC also controls the admission of new mobiles or services attempting to use the core network over its Iu interface.

In an exemplary embodiment, each Node B may maintain a table which prioritizes early decoding attempts on the uplink among different UE's based on predetermined criteria. For example, a UE in soft hand-off (SHO) may cause more interference to other cells than a UE not in SHO, and therefore, system capacity may be improved by more frequently attempting to decode such UE's (in SHO). FIG. 12 illustrates an exemplary embodiment of a table 1200 that may be maintained at a Node B that prioritizes early decoding attempts for the UE's communicating with the Node B on the uplink. In FIG. 12, each UE is represented by a corresponding UE index, and is also mapped to a corresponding allocation indicator. The allocation indicator may specify how often early decoding attempts are to be performed for each UE at the Node B. For example, for UE #1, an allocation indicator of 10 may specify that early decoding may be attempted on UE #1 ten times over the course of a 20-ms TTI, while an allocation indicator of 5 may specify that early decoding may be attempted on UE #2 five times over 20 ms. One of ordinary skill in the art will appreciate that alternative embodiments of allocation indicators may also be readily derived that represent the suggested frequency of early decoding attempts, e.g., a number of slots between every early decoding attempt, etc. The table in FIG. 12 may be maintained at an RNC, and provided to Node B's. Alternatively, each Node B can maintain a separate table, and also respond to requests from other Node B's to, e.g., adjust the early decoding priority of the UE's it services.

It will be appreciated that such techniques may be readily applied by the UE on the downlink as well to, e.g., prioritize early decoding attempts of different channels being received by the UE.

For an air interface, UMTS most commonly uses a wideband spread-spectrum mobile air interface known as wideband code division multiple access (or W-CDMA). W-CDMA uses a direct sequence code division multiple access signaling method (or CDMA) to separate users. W-CDMA (Wideband Code Division Multiple Access) is a third generation standard for mobile communications. W-CDMA evolved from GSM (Global System for Mobile Communications)/GPRS a second generation standard, which is oriented to voice communications with limited data capability. The first commercial deployments of W-CDMA are based on a version of the standards called W-CDMA Release 99.

The Release 99 specification defines two techniques to enable Uplink packet data. Most commonly, data transmission is supported using either the Dedicated Channel (DCH) or the Random Access Channel (RACH). However, the DCH is the primary channel for support of packet data services. Each remote station 123-127 uses an orthogonal variable spreading factor (OVSF) code. An OVSF code is an orthogonal code that facilitates uniquely identifying individual communication channels, as will be appreciated by one skilled in the art. In addition, micro diversity is supported using soft handover and closed loop power control is employed with the DCH.

Pseudorandom noise (PN) sequences are commonly used in CDMA systems for spreading transmitted data, including transmitted pilot signals. The time required to transmit a single value of the PN sequence is known as a chip, and the rate at which the chips vary is known as the chip rate. Inherent in the design of direct sequence CDMA systems is the requirement that a receiver aligns its PN sequences to those of the Node B 110, 111, 114. Some systems, such as those defined by the W-CDMA standard, differentiate base stations 110, 111, 114 using a unique PN code for each, known as a primary scrambling code. The W-CDMA standard defines two Gold code sequences for scrambling the downlink, one for the in-phase component (I) and another for the quadrature (Q). The I and Q PN sequences together are broadcast throughout the cell without data modulation. This broadcast is referred to as the common pilot channel (CPICH). The PN sequences generated are truncated to a length of 38,400 chips. A period of 38,400 chips is referred to as a radio frame. Each radio frame is divided into 15 equal sections referred to as slots. W-CDMA Node Bs 110, 111, 114 operate asynchronously in relation to each other, so knowledge of the frame timing of one base station 110, 111, 114 does not translate into knowledge of the frame timing of any other Node B 110, 111, 114. In order to acquire this knowledge, W-CDMA systems use synchronization channels and a cell searching technique.

3GPP Release 5 and later supports High-Speed Downlink Packet Access (HSDPA). 3GPP Release 6 and later supports High-Speed Uplink Packet Access (HSUPA). HSDPA and HSUPA are sets of channels and procedures that enable high-speed packet data transmission on the downlink and uplink, respectively. Release 7 HSPA+ uses 3 enhancements to improve data rate. First, it introduced support for 2×2 MIMO on the downlink. With MIMO, the peak data rate supported on the downlink is 28 Mbps. Second, higher order modulation is introduced on the downlink. The use of 64 QAM on the downlink allows peak data rates of 21 Mbps. Third, higher order modulation is introduced on the uplink. The use of 16 QAM on the uplink allows peak data rates of 11 Mbps.

In HSUPA, the Node B 110, 111, 114 allows several user equipment devices 123-127 to transmit at a certain power level at the same time. These grants are assigned to users by using a fast scheduling algorithm that allocates the resources on a short-term basis (every tens of ms). The rapid scheduling of HSUPA is well suited to the bursty nature of packet data. During periods of high activity, a user may get a larger percentage of the available resources, while getting little or no bandwidth during periods of low activity.

In 3GPP Release 5 HSDPA, a base transceiver station 110, 111, 114 of an access network sends downlink payload data to user equipment devices 123-127 on High Speed Downlink Shared Channel (HS-DSCH), and the control information associated with the downlink data on High Speed Shared Control Channel (HS-SCCH). There are 256

Orthogonal Variable Spreading Factor (OVSF or Walsh) codes used for data transmission. In HSDPA systems, these codes are partitioned into release 1999 (legacy system) codes that are typically used for cellular telephony (voice), and HSDPA codes that are used for data services. For each transmission time interval (TTI), the dedicated control information sent to an HSDPA-enabled user equipment device 123-127 indicates to the device which codes within the code space will be used to send downlink payload data to the device, and the modulation that will be used for transmission of the downlink payload data.

With HSDPA operation, downlink transmissions to the user equipment devices 123-127 may be scheduled for different transmission time intervals using the 15 available HSDPA OVSF codes. For a given TTI, each user equipment device 123-127 may be using one or more of the 15 HSDPA codes, depending on the downlink bandwidth allocated to the device during the TTI. As has already been mentioned, for each TTI the control information indicates to the user equipment device 123-127 which codes within the code space will be used to send downlink payload data (data other than control data of the radio network) to the device, and the modulation that will be used for transmission of the downlink payload data.

In a MIMO system, there are N (# of transmitter antennas) by M (# of receiver antennas) signal paths from the transmit and the receive antennas, and the signals on these paths are not identical. MIMO creates multiple data transmission pipes. The pipes are orthogonal in the space-time domain. The number of pipes equals the rank of the system. Since these pipes are orthogonal in the space-time domain, they create little interference with each other. The data pipes are realized with proper digital signal processing by properly combining signals on the N×M paths. It is noted that a transmission pipe does not correspond to an antenna transmission chain or any one particular transmission path.

Communication systems may use a single carrier frequency or multiple carrier frequencies. Each link may incorporate a different number of carrier frequencies. Furthermore, an access terminal 123-127 may be any data device that communicates through a wireless channel or through a wired channel, for example using fiber optic or coaxial cables. An access terminal 123-127 may be any of a number of types of devices including but not limited to PC card, compact flash, external or internal modem, or wireless or wireline phone. The access terminal 123-127 is also known as user equipment (UE), a remote station, a mobile station or a subscriber station. Also, the UE 123-127 may be mobile or stationary.

User equipment 123-127 that has established an active traffic channel connection with one or more Node Bs 110, 111, 114 is called active user equipment 123-127, and is said to be in a traffic state. User equipment 123-127 that is in the process of establishing an active traffic channel connection with one or more Node Bs 110, 111, 114 is said to be in a connection setup state. User equipment 123-127 may be any data device that communicates through a wireless channel or through a wired channel, for example using fiber optic or coaxial cables. The communication link through which the user equipment 123-127 sends signals to the Node B 110, 111, 114 is called an uplink. The communication link through which a NodeB 110, 111, 114 sends signals to a user equipment 123-127 is called a downlink.

Figure 11C:
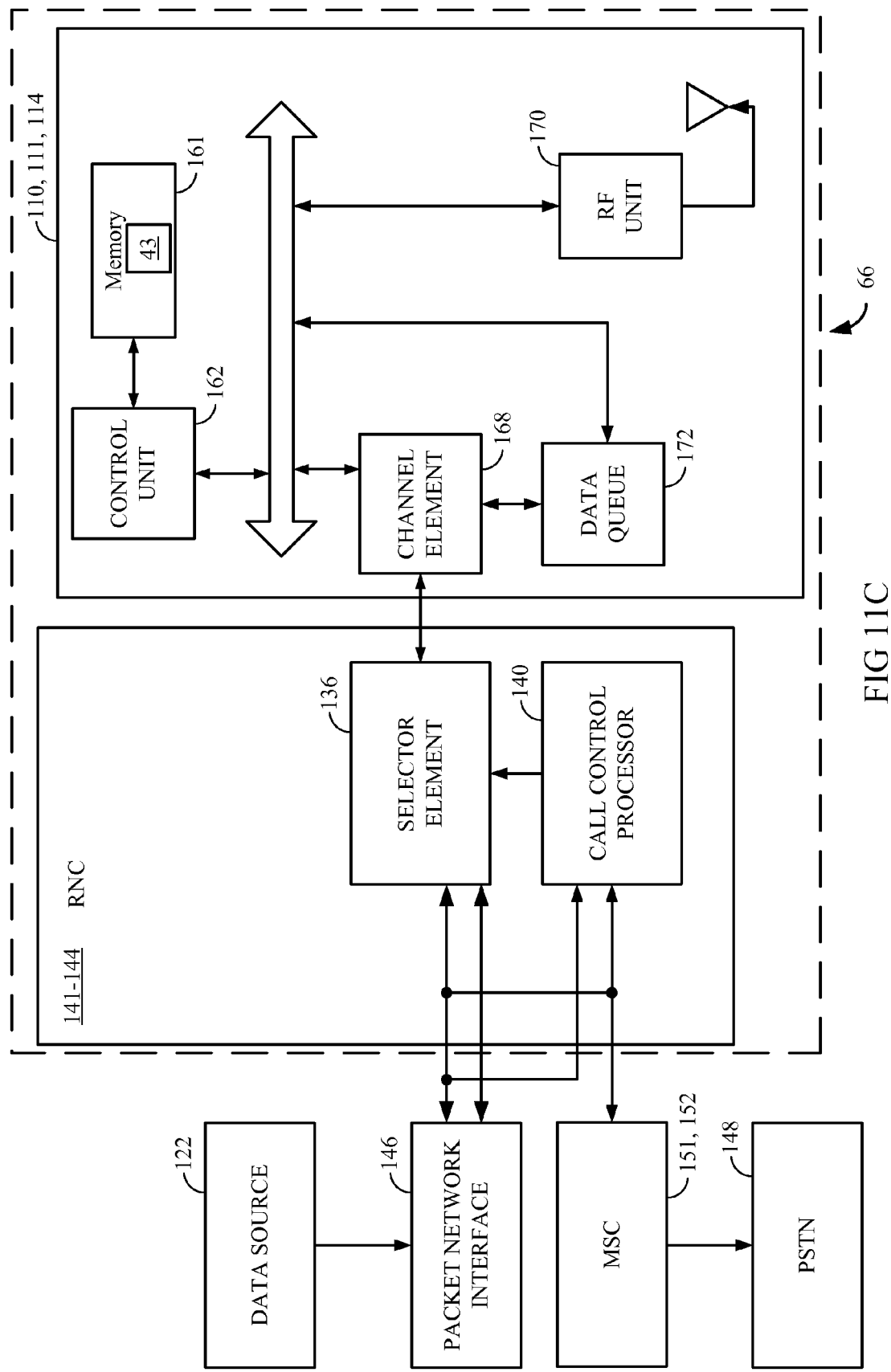

FIG. 11C is detailed herein below, wherein specifically, a Node B 110, 111, 114 and radio network controller 141-144 interface with a packet network interface 146. (Note in FIG. 11C, only one Node B 110, 111, 114 is shown for simplicity.) The Node B 110, 111, 114 and radio network controller 141-144 may be part of a radio network server (RNS) 66, shown in FIG. 11A and in FIG. 11C as a dotted line surrounding one or more Node Bs 110, 111, 114 and the radio network controller 141-144. The associated quantity of data to be transmitted is retrieved from a data queue 172 in the Node B 110, 111, 114 and provided to the channel element 168 for transmission to the user equipment 123-127 (not shown in FIG. 11C) associated with the data queue 172.

Radio network controller 141-144 interfaces with a Public Switched Telephone Network (PSTN) 148 through a mobile switching center 151, 152. Also, radio network controller 141-144 interfaces with Node Bs 110, 111, 114 in the communication system 100B. In addition, radio network controller 141-144 interfaces with a Packet Network Interface 146. Radio network controller 141-144 coordinates the communication between user equipment 123-127 in the communication system and other users connected to a packet network interface 146 and PSTN 148. PSTN 148 interfaces with users through a standard telephone network (not shown in FIG. 11C).

Radio network controller 141-144 contains many selector elements 136, although only one is shown in FIG. 11C for simplicity. Each selector element 136 is assigned to control communication between one or more Node B's 110, 111, 114 and one remote station 123-127 (not shown). If selector element 136 has not been assigned to a given user equipment 123-127, call control processor 140 is informed of the need to page the user equipment 123-127. Call control processor 140 then directs Node B 110, 111, 114 to page the user equipment 123-127.

Data source 122 contains a quantity of data, which is to be transmitted to a given user equipment 123-127. Data source 122 provides the data to packet network interface 146. Packet network interface 146 receives the data and routes the data to the selector element 136. Selector element 136 then transmits the data to Node B 110, 111, 114 in communication with the target user equipment 123-127. In the exemplary embodiment, each Node B 110, 111, 114 maintains a data queue 172, which stores the data to be transmitted to the user equipment 123-127.

For each data packet, channel element 168 inserts the control fields. In the exemplary embodiment, channel element 168 performs a cyclic redundancy check, CRC, encoding of the data packet and control fields and inserts a set of code tail bits. The data packet, control fields, CRC parity bits, and code tail bits comprise a formatted packet. In the exemplary embodiment, channel element 168 then encodes the formatted packet and interleaves (or reorders) the symbols within the encoded packet. In the exemplary embodiment, the interleaved packet is covered with a Walsh code, and spread with the short PNI and PNQ codes. The spread data is provided to RF unit 170 which quadrature modulates, filters, and amplifies the signal. The downlink signal is transmitted over the air through an antenna to the downlink.

At the user equipment 123-127, the downlink signal is received by an antenna and routed to a receiver. The receiver filters, amplifies, quadrature demodulates, and quantizes the signal. The digitized signal is provided to a demodulator where it is despread with the short PNI and PNQ codes and decovered with the Walsh cover. The demodulated data is provided to a decoder which performs the inverse of the signal processing functions done at Node B 110, 111, 114, specifically the de-interleaving, decoding, and CRC check functions. The decoded data is provided to a data sink.

Figure 11D:
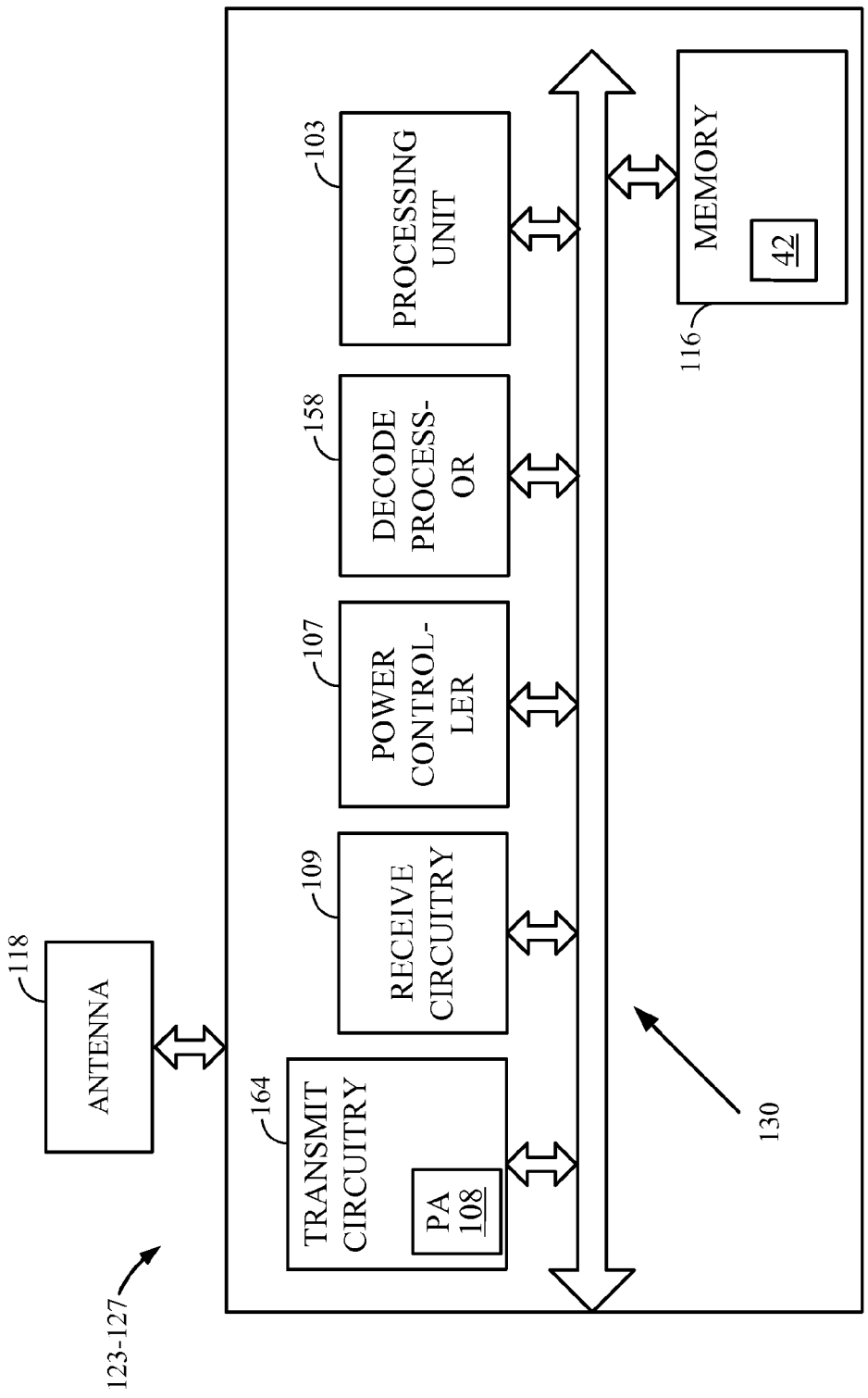

FIG. 11D illustrates an embodiment of a user equipment (UE) 123-127 in which the UE 123-127 includes transmit circuitry 164 (including PA 108), receive circuitry 109, power controller 107, decode processor 158, processing unit 103, and memory 116.

The processing unit 103 controls operation of the UE 123-127. The processing unit 103 may also be referred to as a CPU. Memory 116, which may include both read-only memory (ROM) and random access memory (RAM), provides instructions and data to the processing unit 103. A portion of the memory 116 may also include non-volatile random access memory (NVRAM).

The UE 123-127, which may be embodied in a wireless communication device such as a cellular telephone, may also include a housing that contains a transmit circuitry 164 and a receive circuitry 109 to allow transmission and reception of data, such as audio communications, between the UE 123-127 and a remote location. The transmit circuitry 164 and receive circuitry 109 may be coupled to an antenna 118.

The various components of the UE 123-127 are coupled together by a bus system 130 which may include a power bus, a control signal bus, and a status signal bus in addition to a data bus. However, for the sake of clarity, the various busses are illustrated in FIG. 11D as the bus system 130. The UE 123-127 may also include a processing unit 103 for use in processing signals. Also shown are a power controller 107, a decode processor 158, and a power amplifier 108.

The steps of the methods discussed may also be stored as instructions in the form of software or firmware 43 located in memory 161 in the Node B 110, 111, 114, as shown in FIG. 11C. These instructions may be executed by the control unit 162 of the Node B 110, 111, 114 in FIG. 11C. Alternatively, or in conjunction, the steps of the methods discussed may be stored as instructions in the form of software or firmware 42 located in memory 116 in the UE 123-127. These instructions may be executed by the processing unit 103 of the UE 123-127 in FIG. 11D.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method comprising:
   multiplexing at least two transport channels to generate a composite channel;
   transmitting symbols corresponding to the composite channel during a first allotted transmission time interval (TTI);
   receiving an acknowledgment message (ACK) for at least one of the transport channels during the first allotted TTI during which the symbols are transmitted; and
   puncturing symbols corresponding to the at least one of the acknowledged transport channels for a remainder of the first allotted TTI during which the symbols are transmitted and the ACK is received.

2. The method of claim 1, further comprising, after the puncturing, transmitting the symbols corresponding to the composite channel during a second TTI following the first TTI.

3. The method of claim 1, wherein each TTI is formatted into a plurality of sequential sub-segments, the transmitting comprising continuously transmitting sub-segments of the first frame in sequence.

4. The method of claim 3, wherein each sub-segment comprises a slot.

5. The method of claim 1, further comprising, prior to the multiplexing the at least two transport channels:
   attaching a cyclic redundancy check (CRC) to data of at least one transport channel;
   encoding the data of the at least one transport channel;
   rate matching the data of the at least one transport channel;
   interleaving the data of the at least one transport channel; and
   performing radio frame segmentation on the data of the at least one transport channel.

6. The method of claim 1, further comprising interleaving data of the composite channel, the puncturing comprising, after the interleaving of the data of the composite channel, selectively puncturing the symbols in the composite channel corresponding to the at least one acknowledged transport channel for the remainder of the first allotted TTI.

7. The method of claim 1, further comprising:
   combining data of the composite channel across two or more radio frames; and
   interleaving the combined data across the two or more radio frames prior to the transmitting.

8. The method of claim 1, wherein the at least two transport channels comprise a first transport channel carrying class A bits of an adaptive multi-rate (AMR) codec, a second transport channel carrying adaptive multi-rate (AMR) class B bits, and a third transport channel carrying AMR class C bits, the receiving the ACK comprising receiving the ACK for the first transport channel during the first allotted TTI.

9. The method of claim 8, wherein the receiving the ACK further comprises receiving the ACK for the second transport channel.

10. The method of claim 9, further comprising blanking a dedicated physical data channel (DPDCH) portion of every AMR NULL packet.

11. The method of claim 10, further comprising gating a control portion of predetermined slots of every AMR NULL packet.

12. The method of claim 1, wherein the at least two transport channels comprise a first transport channel carrying adaptive multi-rate (AMR) class A and B bits, and a second transport channel carrying AMR class C bits, the receiving the ACK comprising receiving the ACK for the first transport channel during the first allotted TTI.

13. The method of claim 1, wherein the at least two transport channels comprise at least two transport channels for carrying adaptive multi-rate (AMR) class A, B, and C bits, the method further comprising encoding data for at least one of the at least two transport channels using a tail-biting convolutional code.

14. The method of claim 1, wherein the transmitting comprises transmitting on a downlink of a wideband code division multiple access (W-CDMA) system, the receiving comprising receiving on an uplink of the W-CDMA system during the first allotted TTI.

15. The method of claim 1, the transmitting comprising transmitting on an uplink of a wideband code division multiple access (W-CDMA) system, the receiving comprising receiving on a downlink of the W-CDMA system during the first allotted TTI.

16. The method of claim 15, further comprising spreading data of the composite channel using a spreading factor of 32.

17. An apparatus comprising:
   a multiplexing module configured to multiplex at least two transport channels to generate a composite channel;
   a transmitter configured to transmit symbols corresponding to the composite channel during a first allotted transmission time interval (TTI);
   a receiver configured to receive an acknowledgment message (ACK) for at least one of the transport channels during the first allotted TTI during which the symbols are transmitted; and
   a puncturing module configured to puncture symbols corresponding to the at least one of the acknowledged transport channels for a remainder of the first allotted TTI during which the symbols are transmitted and the ACK is received.

18. The apparatus of claim 17, wherein the transmitter is further configured to, after the puncturing, transmit the symbols corresponding to the composite channel during a second TTI following the first TTI.

19. The apparatus of claim 17, wherein each TTI is formatted into a plurality of sequential sub-segments, the transmitter further configured to continuously transmit sub-segments of the first frame in sequence.

20. The apparatus of claim 19, wherein each sub-segment comprises a slot.

21. The apparatus of claim 17, further comprising:
   a cyclic redundancy check (CRC) attachment block configured to attach a CRC to data of at least one transport channel;
   a channel coding block configured to encode the data of the at least one transport channel;
   a rate matching block configured to rate match the data of the at least one transport channel;
   an interleaving block configured to interleave the data of the at least one transport channel; and
   a radio frame segmentation block configured to perform radio frame segmentation on the data of the at least one transport channel prior to the multiplexing module multiplexing the at least two transport channels.

22. The apparatus of claim 17, further comprising an interleaving block configured to interleave data of the composite channel, the puncturing module further configured to, after the interleaving of the data of the composite channel, selectively puncture the symbols in the composite channel corresponding to the at least one acknowledged transport channel for the remainder of the first allotted TTI.

23. The apparatus of claim 17, further comprising:
a combiner configured to combine data of the composite channel across two or more radio frames; and
an interleaver configured to interleave the combined data across the two or more radio frames prior to the transmitter transmitting the symbols.

24. The apparatus of claim 17, wherein the at least two transport channels comprise a first transport channel carrying class A bits of an adaptive multi-rate (AMR) codec, a second transport channel carrying AMR class B bits, and a third transport channel carrying AMR class C bits, the receiver further configured to receive the ACK for the first transport channel during the first allotted TTI.

25. The apparatus of claim 24, wherein the receiver is further configured to receive the ACK for the second transport channel.

26. The apparatus of claim 25, wherein the transmitter is further configured to blank a dedicated physical data channel (DPDCH) portion of every AMR NULL packet.

27. The apparatus of claim 26, wherein the transmitter is further configured to gate a control portion of predetermined slots of every AMR NULL packet.

28. The apparatus of claim 17, wherein the at least two transport channels comprise a first transport channel carrying adaptive multi-rate (AMR) class A and B bits, and a second transport channel carrying AMR class C bits, the receiver further configured to receive the ACK for the first transport channel during the first allotted TTI.

29. The apparatus of claim 17, wherein the at least two transport channels comprise at least two transport channels for carrying adaptive multi-rate (AMR) class A, B, and C bits, the apparatus further comprising an encoder configured to encode data for at least one of the at least two transport channels using a tail-biting convolutional code.

30. The apparatus of claim 17, wherein the transmitter is further configured to transmit on a downlink of a wideband code division multiple access (W-CDMA) system, the receiver further configured to receive on an uplink of the W-CDMA system during the first allotted TTI.

31. The apparatus of claim 17, wherein the transmitter is further configured to transmit on an uplink of a wideband code division multiple access (W-CDMA) system, the receiver further configured to receive on a downlink of the W-CDMA system during the first allotted TTI.

32. The apparatus of claim 31, wherein the transmitter is further configured to spread data of the composite channel using a spreading factor of 32.

33. An apparatus comprising:
means for multiplexing at least two transport channels to generate a composite channel;
means for transmitting symbols corresponding to the composite channel during a first allotted transmission time interval (TTI);
means for receiving an acknowledgment message (ACK) for at least one of the transport channels during the first allotted TTI during which the symbols are transmitted; and
means for puncturing symbols corresponding to the at least one of the acknowledged transport channels for a remainder of the first allotted TTI during which the symbols are transmitted and the ACK is received.

34. The apparatus of claim 33, wherein the at least two transport channels comprise a first transport channel carrying class A bits of an adaptive multi-rate (AMR) codec, a second transport channel carrying AMR class B bits, and a third transport channel carrying AMR class C bits, the means for receiving the ACK configured for receiving the ACK for the first transport channel.

35. A non-transitory computer-readable storage medium storing instructions for causing a computer to:
multiplex at least two transport channels to generate a composite channel;
transmit symbols corresponding to the composite channel during a first allotted transmission time interval (TTI);
receive an acknowledgment message (ACK) for at least one of the at least two transport channels during the first allotted TTI during which the symbols are transmitted; and
puncture symbols corresponding to the at least one of the acknowledged transport channels for a remainder of the first allotted TTI during which the symbols are transmitted and the ACK is received.

36. The non-transitory computer-readable storage medium of claim 35, wherein the at least two transport channels comprises a first transport channel carrying class A bits of an adaptive multi-rate (AMR) codec, a second transport channel carrying AMR class B bits, and a third transport channel carrying AMR class C bits, the instructions for causing the computer to receive the ACK comprising instructions for causing the computer to receive the ACK for the first transport channel during the first allotted TTI.

* * * * *